United States Patent
Agazzi et al.

(10) Patent No.: US 8,422,591 B2
(45) Date of Patent: *Apr. 16, 2013

(54) SYSTEM AND METHOD FOR HIGH SPEED COMMUNICATIONS USING DIGITAL SIGNAL PROCESSING

(75) Inventors: Oscar E. Agazzi, Irvine, CA (US); Gottfried Ungerboeck, Irvine, CA (US); Keshab K. Parhi, Mission Viejo, CA (US); Christian A. Lutkemeyer, Irvine, CA (US); Pieter Vorenkamp, Aliso Viejo, CA (US); Kevin T. Chan, Pasadena, CA (US); Myles H. Wakayama, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/090,379

(22) Filed: Apr. 20, 2011

(65) Prior Publication Data

US 2011/0206109 A1 Aug. 25, 2011

Related U.S. Application Data

(63) Continuation of application No. 09/797,428, filed on Feb. 28, 2001, now Pat. No. 7,933, 341.

(60) Provisional application No. 60/185,538, filed on Feb. 28, 2000.

(51) Int. Cl.
*H04L 27/00* (2006.01)

(52) U.S. Cl.
USPC .......................... 375/316; 375/340; 375/353

(58) Field of Classification Search .................. 375/265, 375/316, 340, 343, 353; 348/725
See application file for complete search history.

(56) References Cited

U.S. PATENT DOCUMENTS

| | | | | |
|---|---|---|---|---|
| 5,581,577 A | * | 12/1996 | Abe | 375/225 |
| 5,852,477 A | * | 12/1998 | Limberg | 375/350 |
| 6,690,754 B1 | * | 2/2004 | Haratsch et al. | 375/346 |

* cited by examiner

*Primary Examiner* — Sam K Ahn
*Assistant Examiner* — Janice Tieu
(74) *Attorney, Agent, or Firm* — Thomas|Horstemeyer, LLP

(57) ABSTRACT

Various systems and methods related to equalization precoding in a communications channel are disclosed. In one implementation precoding is performed on signals transmitted over an optical channel. In one implementation precoding and decoding operations are performed in parallel to facilitate high speed processing in relatively low cost circuits. Initialization of the precoders may be realized by transmitting information related to the characteristics of the channel between transceiver pairs.

20 Claims, 19 Drawing Sheets

SYSTEM AND METHOD FOR HIGH SPEED COMMUNICATIONS USING DIGITAL SIGNAL PROCESSING

CROSS-REFERENCE TO RELATED APPLICATION(S)

This application is a continuation of application Ser. No. 09/797,428 filed Feb. 28, 2001, which makes reference to, claims priority to and claims the benefit of U.S. Provisional Application No. 60/185,538, filed Feb. 28, 2000.

FIELD OF THE INVENTION

The invention relates generally to data communications and, more particularly, to systems and methods for performing digital signal processing in a communications system and communication devices.

BACKGROUND OF THE INVENTION

The field of data communications relates, in part, to techniques and circuits that facilitate transfer of data over a data channel between components in a communications system. For example, data may be transferred between two computers via a local area network. In addition, data may be transferred within a component. For example, two circuit boards in a communications component such as a switch or a router may communicate via signals routed through a backplane in the switch or the router.

There is a perpetual need for increased operating speed in data communications systems. On the one hand, developers are continually creating applications that require increasingly greater amounts of data to be sent between system components. On the other hand, end users in general want their applications to run faster which, in turn, often requires that associated data transfers are performed more quickly.

In an attempt to address the need for faster data communications, various groups have developed standards that specify high speed data transfers between components of data communication systems. For example IEEE standards 802.3ab and 802.3z define Ethernet systems for transferring data at rates up to one gigabit per second (1 Gbit/s). IEEE standard 802.3ae defines an Ethernet system for transferring data at rates up to 10 Gbits/s.

The development of these standards and the ever increasing need for faster data transfers create a need for techniques and circuits capable of achieving high data transfer rates while at the same time providing high reliability over relatively long distances. Moreover, there is an ever present economic motivation to achieve such results in a cost effective manner.

SUMMARY OF THE INVENTION

The invention is directed to data transmission systems and methods incorporating digital signal processing such as equalization precoding and parallel processing to achieve reliable data transmission at relatively high data transfer rates. The invention provides equalization precoding in transmission systems with optical channels and provides parallel processing techniques for optical and non-optical channel systems to increase the speed of the precoding and/or other processing. Moreover, the teachings of the invention may, in substantial part, be implemented in CMOS technology thereby providing a relatively low cost solution.

One embodiment of a system constructed according to the invention consists of a transceiver incorporating digital signal processors that process signals to be transmitted and received over a channel. In a transmit section of the transceiver a digital signal processor performs trellis encoding and Tomlinson-Harashima precoding for encoding the signals to be transmitted. In a receive section of the transceiver a digital signal processor performs forward equalization and Viterbi decoding for decoding signals received over the channel.

One embodiment of the transceiver processes signals for an optical channel. Significantly, this embodiment enables relatively high speed data transmission (e.g., 10 Gbits/s) over fiber optic cables such as multimode fiber that have relatively poor performance characteristics. This is accomplished by the precoding scheme which compensates for the characteristics of the optical channel. Thus, this embodiment can provide high speed data transfers over relatively long fiber spans. Significantly, this technique is in many respects more effective than conventional solutions (e.g., restricted mode launch, offset launch and vortex launch) that have been used to overcome bandwidth limitations of fiber optic cables.

One embodiment of the transceiver incorporates parallel encoding and decoding for processing signals for optical or non-optical channels. For example, the transmit section performs the trellis encoding and Tomlinson-Harashima precoding in parallel. And the receive section performs the forward equalization and Viterbi decoding in parallel. Significantly, this embodiment can be implemented in relatively low cost CMOS technology, thereby providing high performance with low cost components.

Another embodiment of a system constructed according to the invention incorporates a precoder initialization scheme whereby information related to the characteristics of the channel are transmitted from the receive section of one transceiver to the transmit section of another transceiver at the other end of the channel.

BRIEF DESCRIPTION OF THE DRAWINGS

These and other features, aspects and advantages of the present invention will be more fully understood when considered with respect to the following detailed description, appended claims and accompanying drawings, wherein:

DETAILED DESCRIPTION OF THE INVENTION

The invention is described below, with reference to detailed illustrative embodiments. It will be apparent that the invention can be embodied in a wide variety of forms, some of which may be quite different from those of the disclosed embodiments. Consequently, the specific structural and functional details disclosed herein are merely representative and do not limit the scope of the invention.

Figure 1:
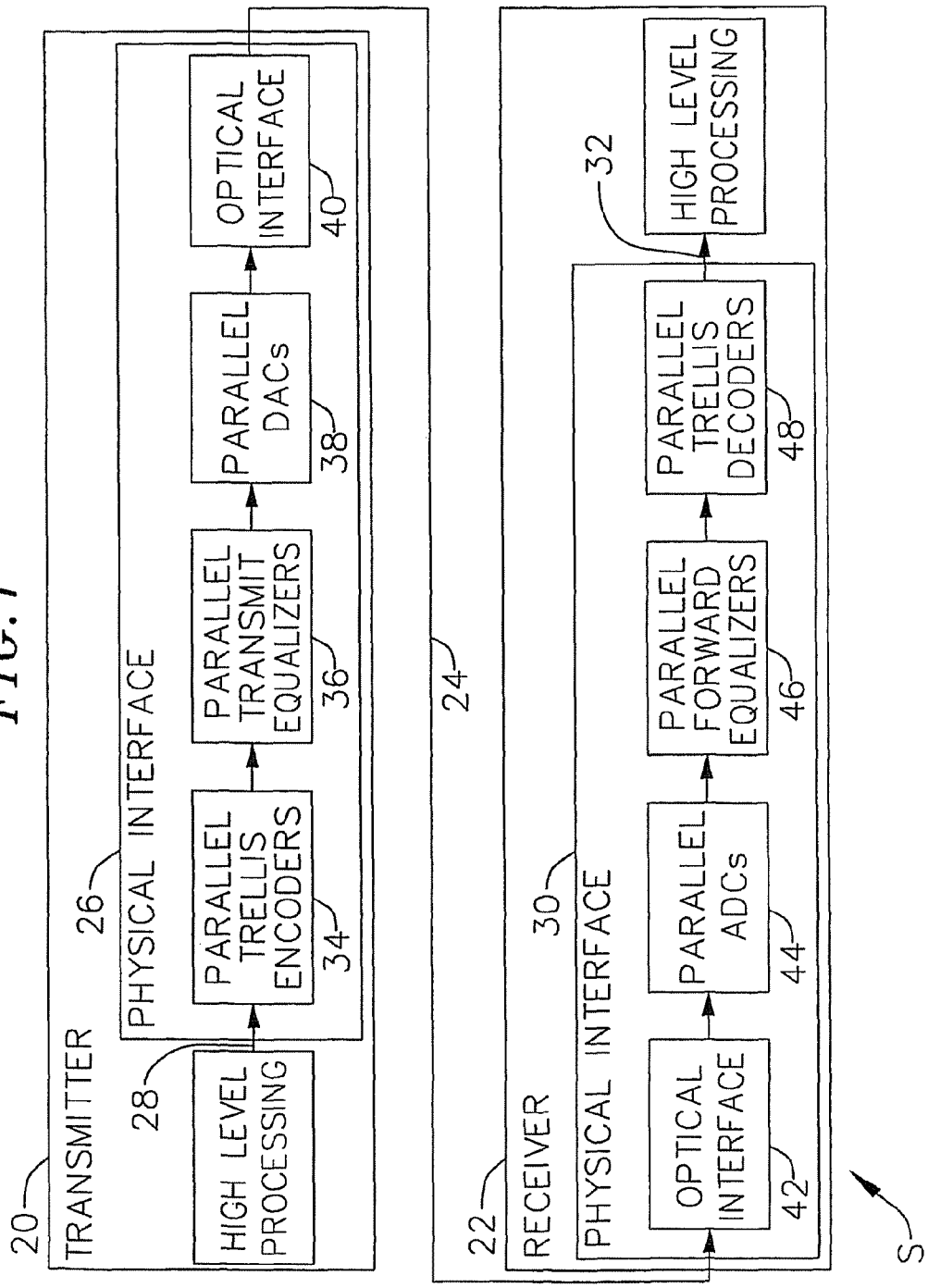
FIG. 1 is a block diagram of one embodiment of a system incorporating equalization precoding for an optical channel in accordance with the invention.

FIG. 1 is a simplified block diagram of one embodiment of a data transmission system S utilizing equalization precoding in accordance with the invention. A transmitter 20 sends data to a receiver 22 over an optical channel 24. In a typical implementation, the transmitter 20 communicates with the receiver 22 according to the International Standard's Organization Open Systems Interconnection (ISO) model. The ISO model defines various protocols for formatting the data. Here, each protocol defines formatting for different stages of transmission ranging from a presentation level (presentation of the data to the end user) to a physical level (transmission of the data over a physical medium). In the OSI context, the invention is primarily concerned with the physical level.

In FIG. 1, the high level processing in the transmitter 20 formats a data stream to generate packetized data per the OSI model. This data is sent to a transmit physical interface 26, typically via a parallel data bus 28. The transmit physical interface 26 processes the data to a form suitable for transmission over a particular type of channel (e.g., optical). A corresponding receive physical interface 30 in the receiver 22 processes signals received over the channel 24 and presents them via bus 32 to the non-physical layers (e.g., high level processing) for processing per the OSI model.

In accordance with the invention, the physical interfaces and 30 provide equalization to compensate for the characteristics of the channel 24. Moreover, in this embodiment, the physical interfaces 26 and 30 include parallel structures for performing equalization processing (encoding or decoding) in parallel.

The equalization function is at least partially provided in the transmitter portion 20 of the system S. A set of parallel trellis encoders 34 processes data from the data bus 28. A set of parallel transmit equalizers 36 process data from the trellis encoders 34. For example, the output of each trellis encoder may be sent to a unique transmit equalizer. Parallel digital to analog converters (DACs) 38 convert the output of the parallel transmit equalizers 36 to a serial analog stream which drives a transmit optical interface 40.

On the receiving end of the optical channel 24, a receive optical interface 42 drives parallel analog to digital converters (ADCs) 44. The ADCs 44 provide digital streams to a set of parallel forward equalizers 46. A set of parallel trellis decoders process 48 data from the equalizers 46. For example, the output of each forward equalizer may be sent to a unique trellis decoder.

The operation and implementation of the components of FIG. 1 will be discussed in more detail in conjunction with the remaining figures. To facilitate a better understanding of these components, the objectives of the embodiment of FIGS. 2-6 will be discussed.

This embodiment utilizes five-level pulse amplitude modulation (PAM-5) signaling at 5 gigabaud per second (5 Gbaud/s). The optical channel typically consists of a standard 62.5/125 μm fiber optic cable with a bandwidth of 160 MHz/ 500 Mhz·kilometer for 850 nm/1310 nm lasers, respectively. For example, for a fiber length of 500 meters the bandwidth of the fiber is 1 Ghz for a 1310 nm laser.

Significantly, the system incorporates adaptive equalization for compensating for intersymbol interference introduced by the limited bandwidth of the multimode fiber. That is, the adaptive equalizer tracks the variations of the laser and fiber response over time and, in response, the system provides appropriate compensation to the signals. For example, the system uses nonlinear equalization to compensate for the nonlinearity of the laser. In this embodiment, the transmit equalizer 36 of FIG. 1 is implemented as a Tomlinson-Harashima precoder.

Through the use of parallel processing in the transmitter, receiver and data converters, a CMOS integrated circuit constructed according to the invention may achieve a 5 GHz effective sampling rate with a 312.5 MHz actual clock rate. In sum, the embodiment of FIGS. 2-6 uses a 4-dimensional, 8-state, 4-way interleaved Ungerboeck trellis coding and may achieve a coding gain of approximately 6 dB over an uncoded PAM-5 system.

Figure 3:
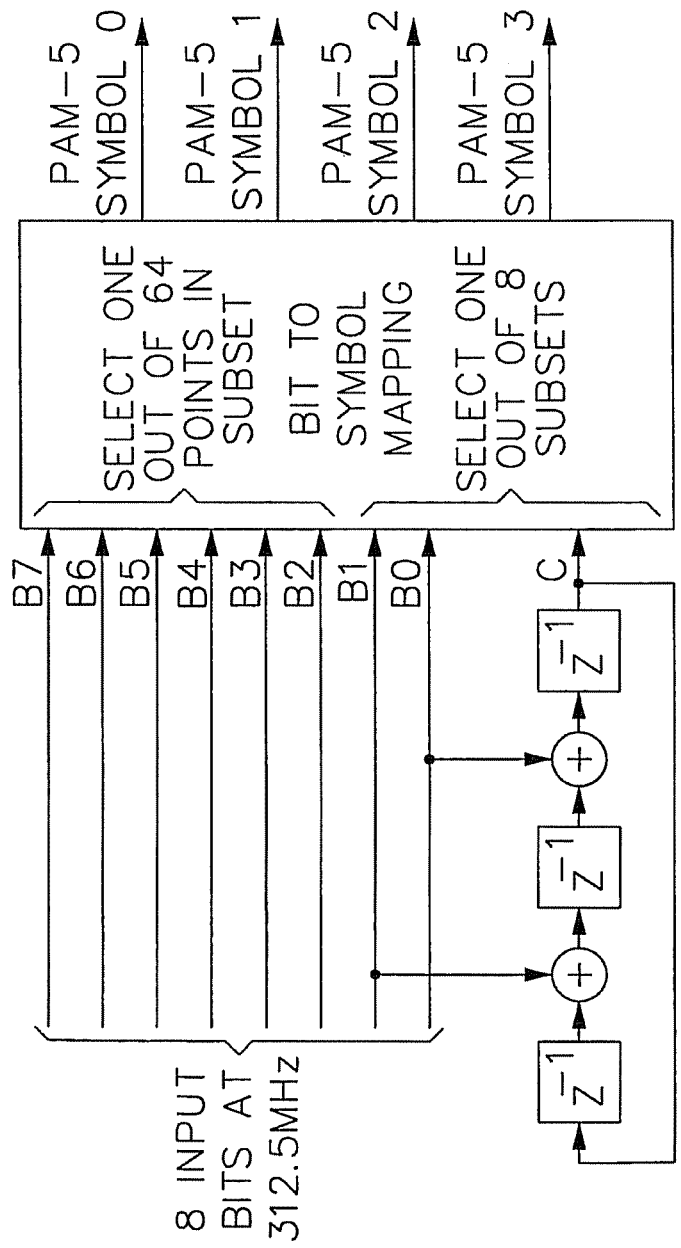
FIG. 3 is a block diagram of one embodiment of a trellis encoder that may be used in the transmitter of FIG. 2.
Figure 4:
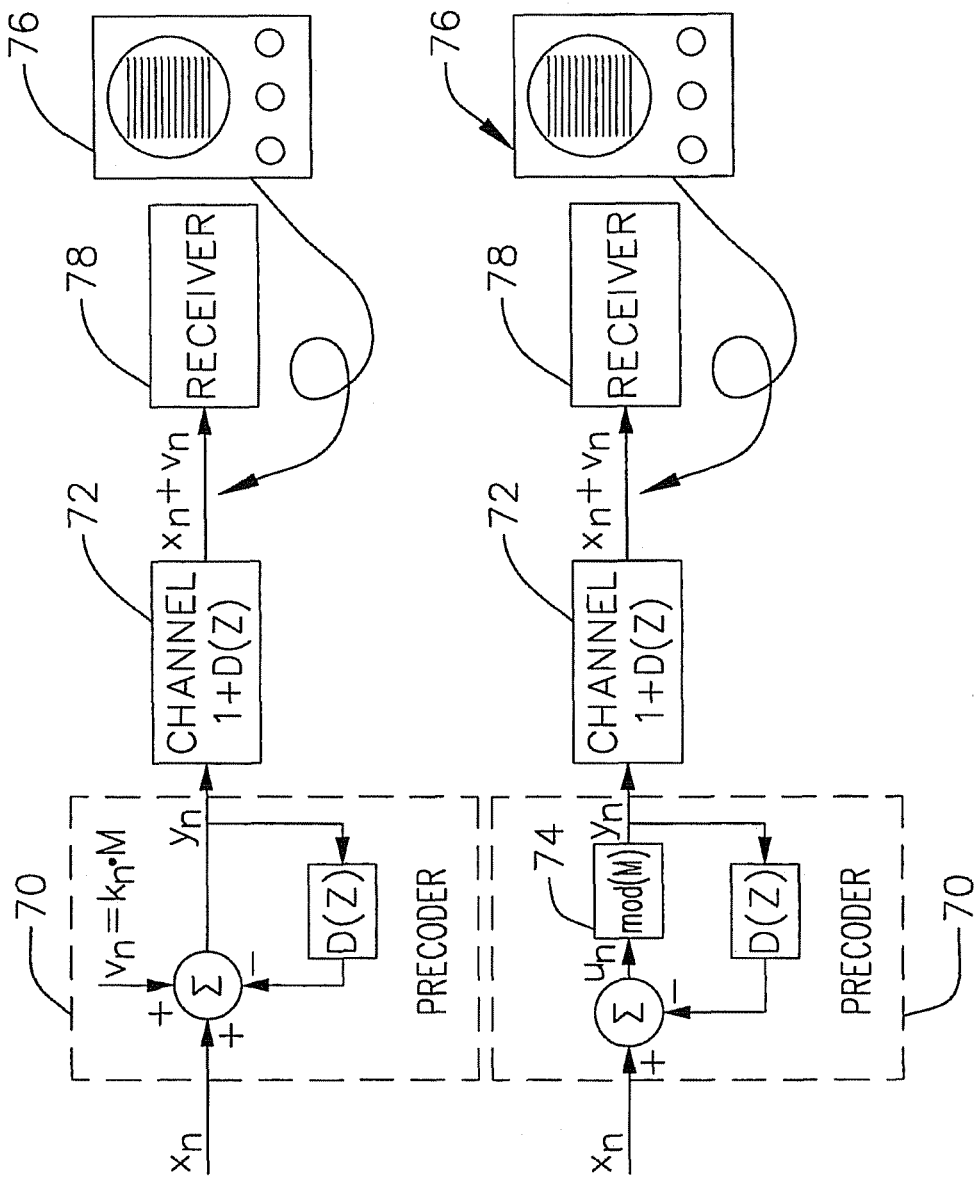
FIG. 4 is a block diagram of one embodiment of a Tomlinson-Harashima precoder that may be used in the transmitter of FIG. 2.
Figure 5:
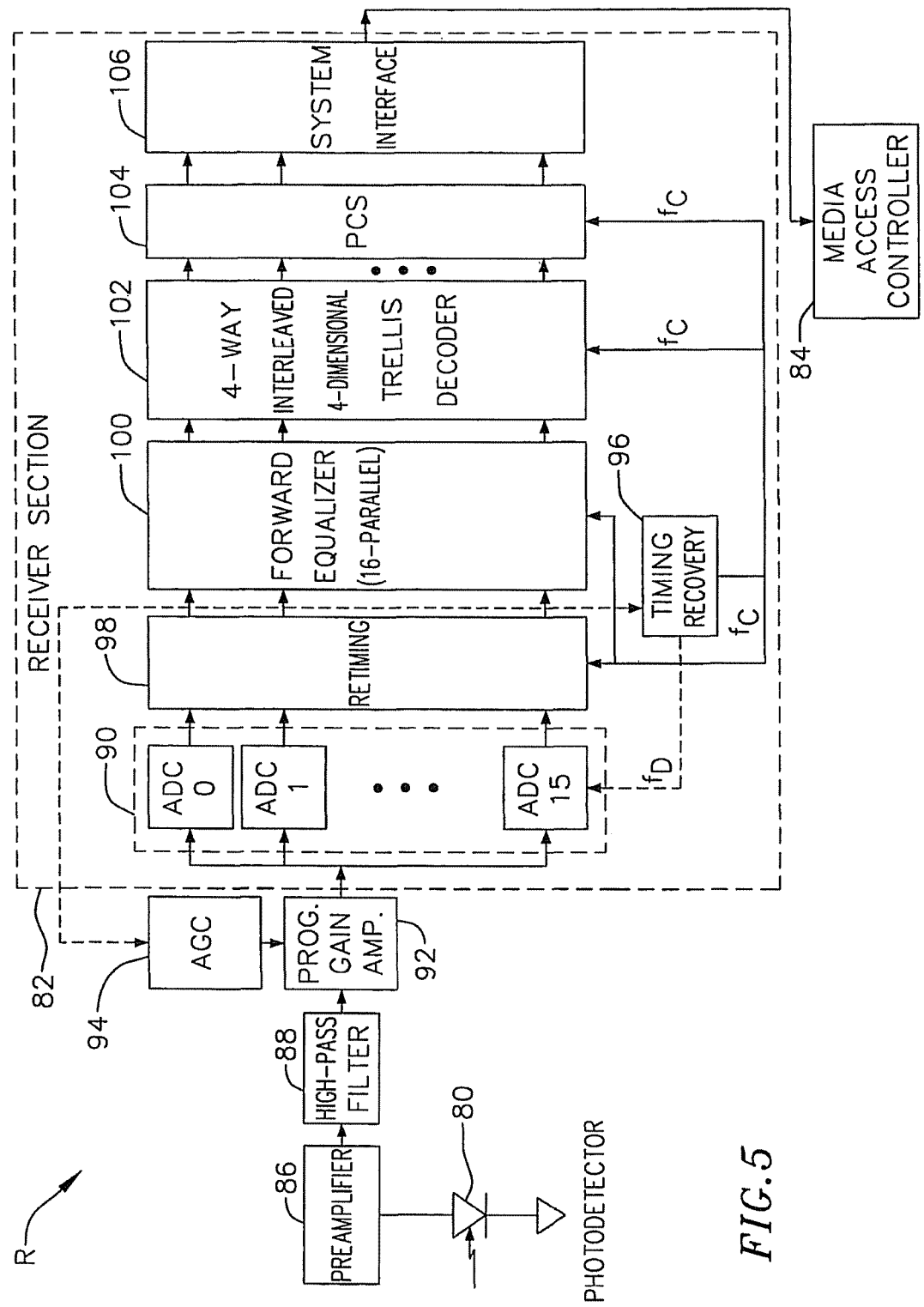
FIG. 5 is a block diagram of one embodiment of a receiver that may be used in conjunction with the transmitter of FIG. 2.
Figure 6:
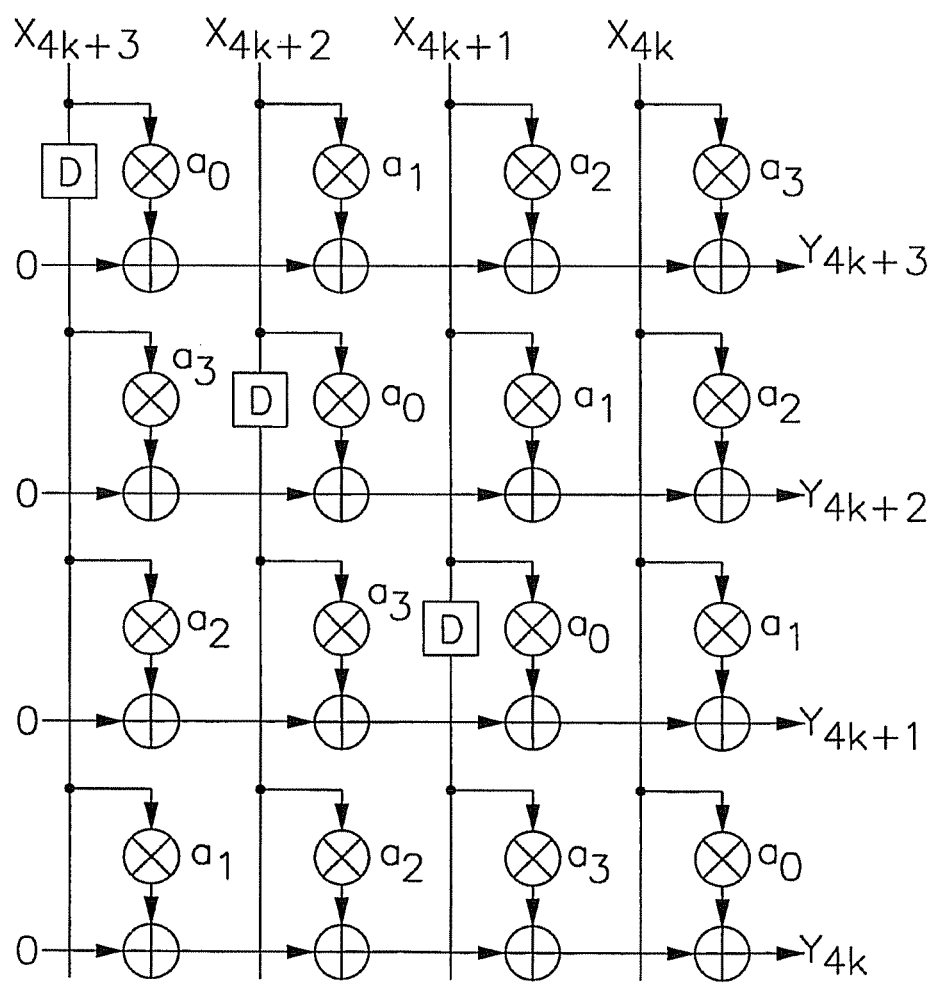
FIG. 6 is a block diagram of one embodiment of a forward equalizer that may be used in the receiver of FIG. 5.

Referring now to FIGS. 2-6, FIGS. 2-4 depict simplified block diagrams of selected components for a transmitter. FIGS. 5-6 depict simplified block diagrams of selected components for a receiver. These components are described as part of a 10 Gbit/s Ethernet system. In one embodiment, the transmitter and receiver sections described herein are implemented as a transceiver integrated circuit constructed as a single chip.

Figure 2:
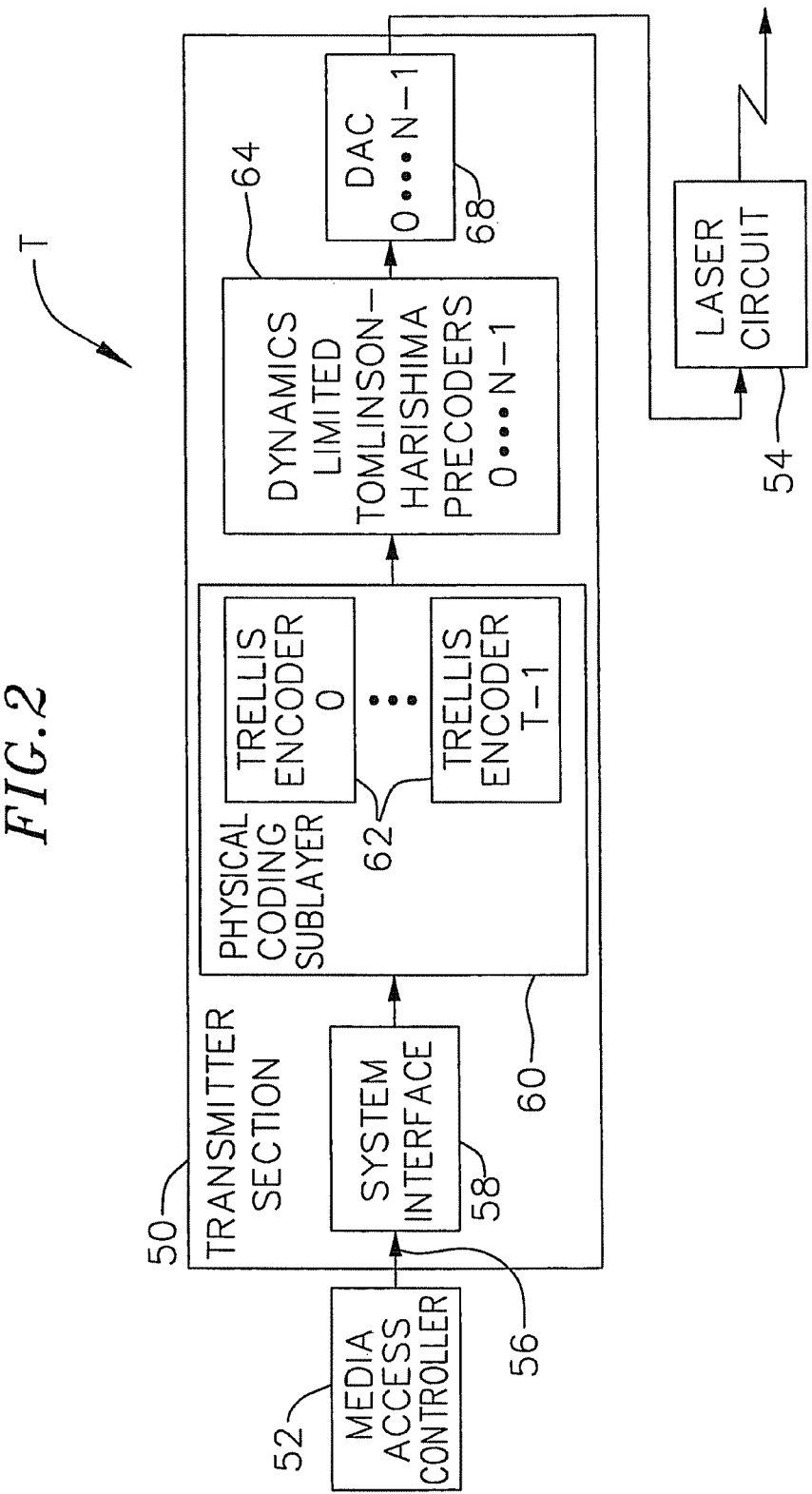
FIG. 2 is a block diagram of one embodiment of a transmitter incorporating parallel equalization precoding in accordance with the invention.

In the transmitter T of FIG. 2, a transmitter section 50 encodes signals received from a media access controller 52 to provide an encoded data stream that drives a laser circuit 54. The laser circuit 54 generates optical signals that are sent over an optical channel (not shown).

The basic operation of the media access controller 52 is known in the art and will not be treated in detail here. For a 10 Gbit/s implementation, a data bus 56 from the, media access controller 52 to the transmitter section 50 comprises 32 signals, each of which operates at 312.5 MHz.

A system interface 58 terminates the signals from the data bus 56 and routes them to a physical coding sublayer 60. In general, the operations of the system interface 58 and the physical coding sublayer 60 are known in the art. For example, the physical coding sublayer 60 performs operations such as scrambling, idle generation, start of stream delimiter insertion and end of stream delimiter insertion.

In accordance with one embodiment of the invention, the physical coding sublayer 60 also incorporates a set of parallel trellis encoders 62. For example, the code may operate in blocks of sixteen samples with a block rate of 5 GHz/16=312.5 MHz. This provides an intrinsic parallelism (by a factor of 16) in both the encoder and the decoder (discussed below), which run at a clock rate of 312.5 MHz. The teachings of the invention may be applied to any number of levels of parallelism. For example, for a 5 GHz input the system may incorporate eight levels operating at 625 MHz. In general, the number of parallel levels and the speed at which they operate will depend on system design goals.

As represented by the designations on the trellis encoders 62, any number of trellis encoders 62 may be used in implementing the teachings of the invention. For the purposes of this example, the designation "T" is four. Thus, there are four trellis decoders 62 operating in parallel.

FIG. 3 depicts one embodiment of one of the trellis encoders. Each encoder processes eight of the 32 input signals and outputs four PAM-5 signals. In this embodiment, the encoder consists of a 4-dimensional, 8-state Ungerboeck trellis encoder. Thus, the combination of the four parallel trellis encoders 62 provides 4-dimensional, 8-state, 4-way interleaved Ungerboeck trellis coding.

The four dimensions consist of four consecutive samples of the signal. For each block of sixteen samples, the first four samples are processed by the first trellis encoder, the next four samples are processed by the second trellis encoder, and so forth.

Referring again to FIG. 2, the outputs of the trellis encoders 64 are routed to a set of parallel dynamics limited Tomlinson-Harashima precoders 64. As represented by the designation: "0 . . . N−1," any number of precoders may be used in implementing the teachings of the invention. For the purposes of this example, the designation "N" is sixteen. Thus, in this embodiment there are sixteen precoders operating in parallel.

The operation of one embodiment of one of the Tomlinson-Harashima precoders is described in conjunction with FIG. 4. The precoder is basically, in one embodiment, a filter with a response equal to the inverse of the response of the channel. For example, if the channel response has a z-transform 1+D (z), the precoder typically would have a response 1/(1+D(z)). Such a precoder 70 and channel 72 are illustrated, for example, in the top half of FIG. 4.

In practice, the inverse filter could introduce high gain at some frequencies (where the channel has high attenuation). This could result in high peak values and high power at the output of the transmitter. To prevent this, a sequence $v_n=k_n \cdot M$ is added to the transmitted data sequence $x_n$. For a PAM-5 alphabet ($x \in \{-2, -1, 0, 1, 2\}$), M=5 and $k_n$ is an arbitrary integer, such that $x_n+v_n$ belong to the extended alphabet $\{\ldots, -7, -6, -5, -4, -3, -2, -1, 0, 1, 2, 3, 4, 5, 6, 7, \ldots\}$. Here, the specific choice of $k_n$ is made on a symbol by symbol basis with the objective of minimizing the transmitted power.

In traditional Tomlinson-Harashima precoding a wrap-around (or overflow) operation is used to automatically generate $v_n$. This operation is denoted with the block mod(M) 74 in the bottom half of FIG. 4. When the input is $u_n \geq M/2$, the mod(M) operation forces $y_n$ to the interval [−M/2, M/2] by adding $k_n \cdot M$ with $k_n<0$. Similarly, when input $u_n<M/2$, the mod(M) operation forces $y_n$ to the interval [−M/2, M/2] by adding $k_n \cdot M$ with $k_n>0$. One will observe that this is the same operation as the two's complement representation of a number $u_n$ when it overflows a register having a word length that allows representing numbers in the interval [−M/2, M/2].

The received signal is $x_n+v_n$. A perfectly open eye pattern may be achieved at the input of the receiver (as represented by the hypothetical display device 76). However, the number of levels is larger than in the original alphabet. That is, in a PAM-5 implementation there will be more than five levels at the input of the receiver. To get the desired five levels the slicer determines $x_n$ by finding the value of $k_n$ that makes $x_n+v_n-k_n \cdot M$ fall within the original PAM-5 alphabet $\{-2, -1, 0, 1, 2\}$.

In Tomlinson-Harashima precoding $k_n$ can take arbitrary integer values to strictly enforce the condition $-M/2 \leq y_n \leq M/2$. This could result in large values of $x_n+v_n$, the signal at the input of the receiver 78. To reduce the dynamic range of the ADCs, it is desirable to constrain $x_n+v_n$. For example, in a PAM-5 system k may be selected such that $x_n+v_n \in \{-4, -3, -2, -1, 0, 1, 2, 3, 4\}$. This results in a slight increase in the transmit power. However, this also reduces the required resolution of the ADCs.

Referring again to FIG. 2, the output of each of the sixteen precoders 64 is routed to a set of parallel DACs 68. Again, as represented by the designation: "0 . . . N−1," the number of DAC inputs matches the number of precoder outputs. Thus, in this embodiment there are sixteen DAC inputs. The DACs 68 convert the sixteen digital signals to a single 5 Gbaud/s serial stream that drives the laser circuit 54.

Referring to FIGS. 5-6, the operation of the receiver will now be discussed. In the receiver R of FIG. 5, a photodetector 80 receives optical signals from an optical channel (not shown) to provide an encoded data stream to a receiver section 82. The receiver section decodes the data stream and routes the decoded data to a media access controller 84.

In a manner similar to conventional high speed optical receivers, the output of a photodetector 80 is amplified by a preamplifier 86 and filtered by a high pass filter 88. Typically, the high pass filter 88 compensates for baseline wander.

The amplitude of the input signal to the set of parallel ADCs 90 is controlled by a programmable gain amplifier 92. The gain of the amplifier 92 is controlled by an automatic gain control 94. Significantly, the combination of the digitally controlled automatic gain control 94 and the analog programmable gain amplifier 92 provides a more effective method of controlling gain for an optical channel. By digitally processing the received optical signals, the gain of the amplifier 92 may be controlled more effectively. This may provide, in part, a method of efficiently utilizing the resolution of the ADCs 90.

A timing recovery circuit 96 provides a number of clocks to the components of the receiver R. In this embodiment, $f_B$, the baud rate clock, runs at 5 GHz, $f_C$ is $f_B/16=312.5$ MHz and, as discussed below, $f_D$ is a sixteen phase version of $f_C$. It will be understood that these frequencies are examples and will depend, in part, on the speed of operation of the circuits and the number of parallel circuits in the receiver. For example, in a preferred embodiment eight ADCs will be used, each of which will run at a clock frequency of 625 MHz for a 5 Gbaud/s input signal.

The set of parallel ADCs 90 sample the received analog data stream and generate digital signals (e.g., 6 bits per symbol) representative of the analog input signal. In the embodiment depicted, there are sixteen ADCs running at 312.5 Mhz. It will be understood that the number of ADCs and the speed at which they operate will depend on system design goals.

Each of the ADCs is driven by a unique phase of clock $f_D$. Thus, each of the ADCs will sample a different input symbol. This operation is analogous to a time-division demultiplexing operation on the input stream.

Since the outputs of the ADCs are out of phase with respect to one another, a retiming circuit 98 is used to, in effect, align the signals to provide sixteen samples during each clock cycle of $f_C$ to a set of parallel forward equalizers 100.

The forward equalizers 100 provide phase equalization (all-pass response) that equalizes, to some degree, the non-minimum-phase fiber response. FIG. 6 depicts a portion (to reduce the complexity of the figure) of one embodiment of a parallel forward equalizer, specially, four parallel 4-tap finite impulse response (FIR) filters. Here, $y(n)=a_0x(n)+a_1x(n-1)+a_2x(n-2)+a_3x(n-3)$.

It will be understood that for a different number of inputs, the FIR filter of FIG. 6 will be expanded to accept that number of inputs and provide that number of outputs. The FIR filter also will be expanded with respect to the number of filter taps. For example, in the embodiment of FIG. 5, the FIR filter has sixteen inputs, sixteen outputs and sixteen filter taps. It should be appreciated, however, that the number of filter taps will not always equal the number of parallel blocks as is the case in this example.

The outputs of the forward equalizers 100 drive a 4-way interleaved, 4-dimensional trellis decoder 102. In a preferred embodiment the trellis decoder is a Viterbi decoder. As indicated in FIG. 5, the Viterbi decoders for this example operate at a clock speed of 312.5 MHz. Significantly, the use of precoding in this embodiment simplifies the implementation of the Viterbi decoder because the Viterbi decoder does not need to be designed to handle intersymbol interference. Thus, the decoder does not have to be combined with decision feedback equalization, even though the decoder speed is very high. Moreover, branch metrics can be pipelined. Thus, virtually all critical path issues in the Viterbi decoder are eliminated.

The outputs of the parallel trellis decoders 102 drive a physical coding sublayer 104. The physical coding sublayer 104 performs several operations that are complementary to those performed by the physical coding sublayer 60 of FIG. 2. This may include, for example, bit manipulation, descrambling and demultiplexing.

After the physical coding sublayer 104, the signals are routed to a system interface 106 and then off of the chip to the media access controller 84.

The parallel implementation of the precoder is relatively difficult due to the feedback loop. The invention is based, in part, on the realization that look-ahead techniques can be used to implement the precoder in a pipelined or parallel architecture. FIGS. 7-12 describe several implementations for a parallel precoder. These examples use a filter length, N, of 30 and a level of parallelism, L, of 16. In general, the number of filter taps that are needed depends on the characteristics of the channel (e.g., the fiber). For example, the length of the impulse response of the fiber determines the number of coefficients that are needed which, in turn, defines the number of taps.

Figure 7:
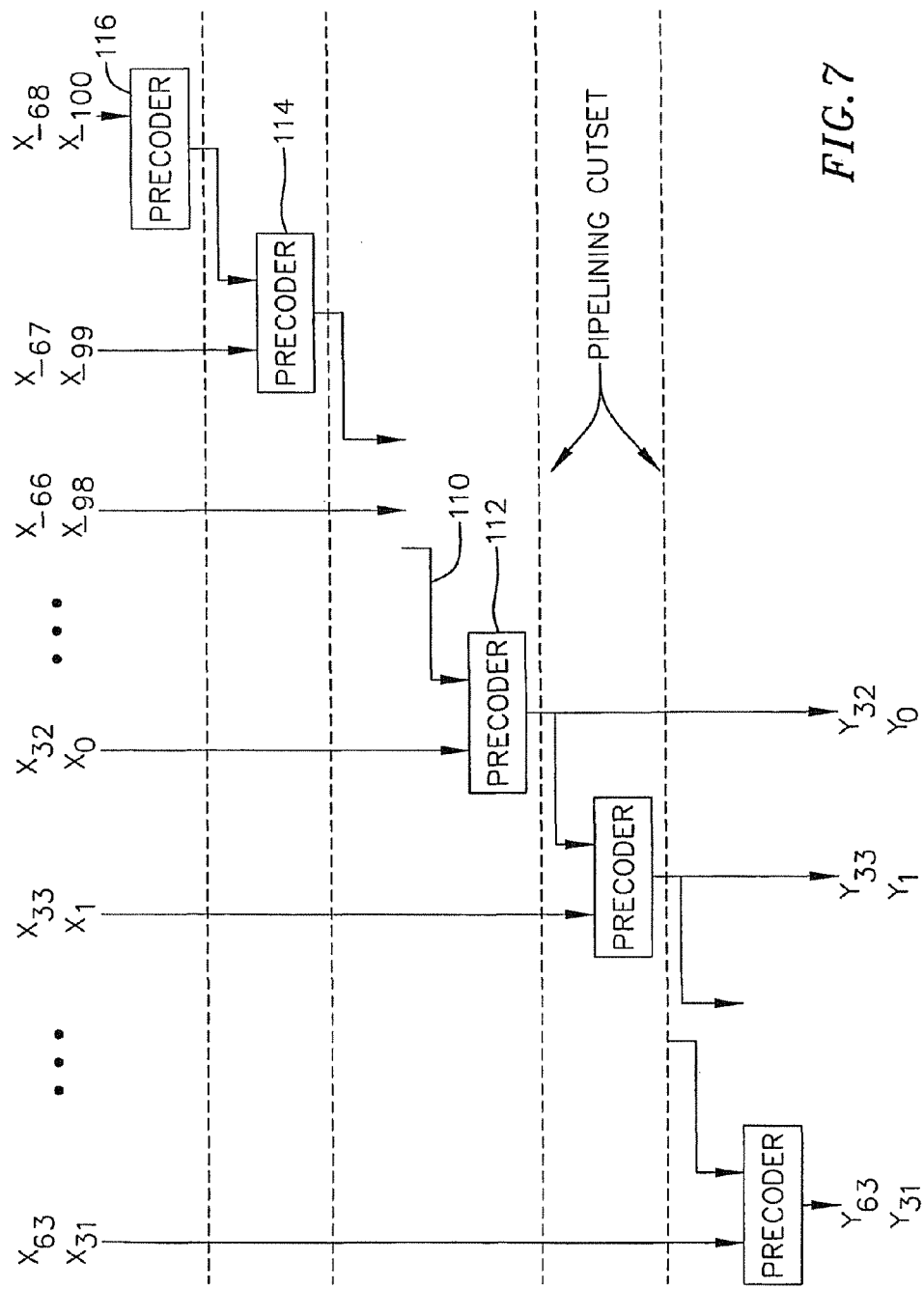
FIG. 7 is a block diagram of one embodiment of a parallel Tomlinson-Harashima precoder in accordance with the invention.

FIG. 7 is a simplified block diagram of a low latency parallel precoder incorporating overlapped block precoding. This embodiment is for a 32 wide precoder. That is, it provides 32 levels of parallelism. To reduce the complexity of FIG. 7 only a few representative precoders and associated inputs and outputs have been illustrated.

In effect, this embodiment provides the feedback data for a precoder via a set of parallel precoders that operate on a series of earlier input states. For example, the input signal 110 for precoder 112 comprises information for input states $x_{-1}$ through $x_{-100}$ via decoders 114 and 116 and the intervening decoders that are not shown and their associate inputs (e.g., $x_{-99}$ and $x_{-100}$ and the other inputs that are not shown).

It has been observed that good results may be obtained when the amount of overlap is equal to approximately three times the number of taps. Thus, for this embodiment (32 taps), a length of overlap for each precoder has been selected to be 100. The amount of overlap may be characterized as the number of samples that are necessary for the transient response of the filter to reach a sufficiently low level such that the filter closely approximates an ideal filter with an infinite number input samples. The transient response depends on the parameters of the filter, e.g., the closeness of the poles to the unit circle in the frequency domain. In practice the precise amount of overlap for a given system may be selected based on the characteristics (e.g., S/N) that are desired in the communication system.

The embodiment of FIG. 7 provides a relatively low latency of 32 clock cycles. However, it does require a relatively large number of precoders (132) with their associated multipliers (132×30=3960, for 32 outputs).

Figure 8:
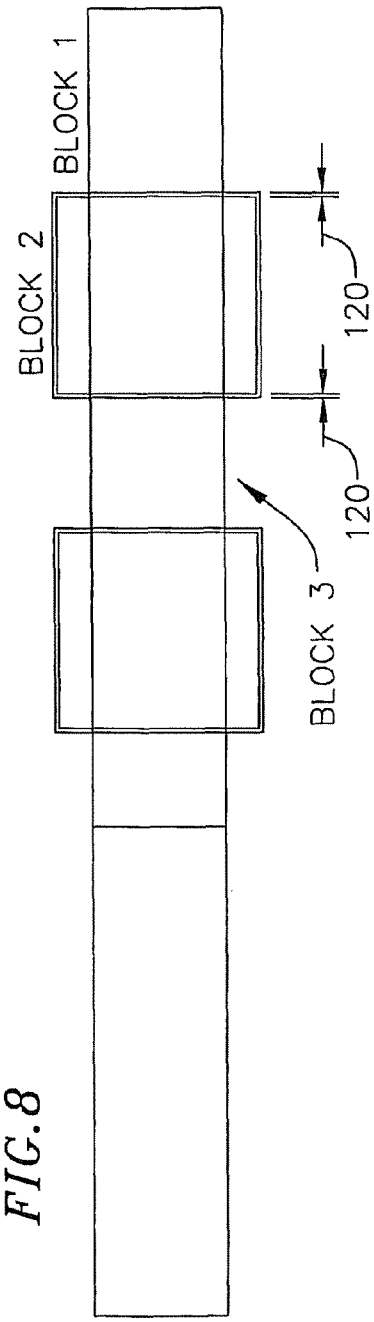
FIG. 8 is a conceptual block diagram relating to another embodiment of a parallel Tomlinson-Harashima precoder in accordance with the invention.

FIG. 8 is a conceptual block diagram for another embodiment of a parallel precoder. The input stream is divided into sixteen overlapping blocks. In this example, the block length is selected as 1000 and the overlap 120 between each block is equal to 3 N, which has been rounded up to 100. The overlap 120 provides the necessary inputs from previous states for those samples near a block boundary. Each block is filtered independently, and the first 100 outputs are discarded. Thus processing overhead is increased by 10%. The sizes of the blocks are selected to enable each block to, in effect, operate independently of the other blocks. In this way one can define a filter response that is as close to the desired optimal response as is practical.

Figure 9:
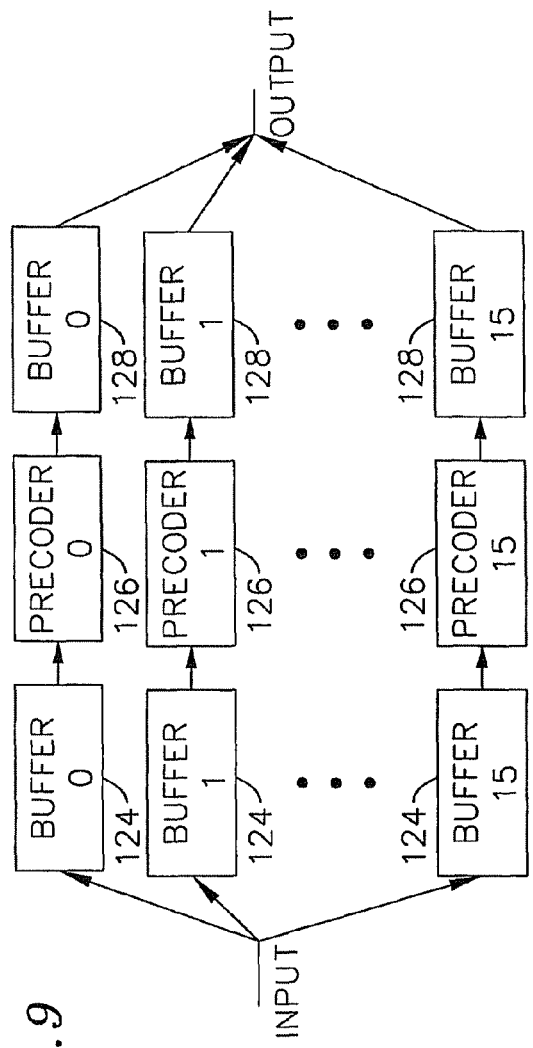
FIG. 9 is a block diagram of one embodiment an implementation of the parallel Tomlinson-Harashima precoder of FIG. 8.

Referring to FIG. 9, the embodiment of FIG. 8 is implemented by routing the input to sixteen buffers 124. For example, buffer 0 may store the 1000 bits for block 0, buffer 1 may store the 1000 bits for block 1 and so forth. Each precoder then sequentially processes the bits in its block of 1000 bits and outputs its results to an associated buffer 128. The outputs of the buffers 128 are multiplexed to form the precoded data.

To reduce the complexity of FIGS. 8 and 9 only a few representative blocks, buffers and precoders have been illustrated.

This embodiment has the advantage that only sixteen precoders are needed and, consequently, 480 multipliers (16×30). However, the buffers must operate at 5 GHz and additional circuitry is required to provide the buffers.

Figure 10:
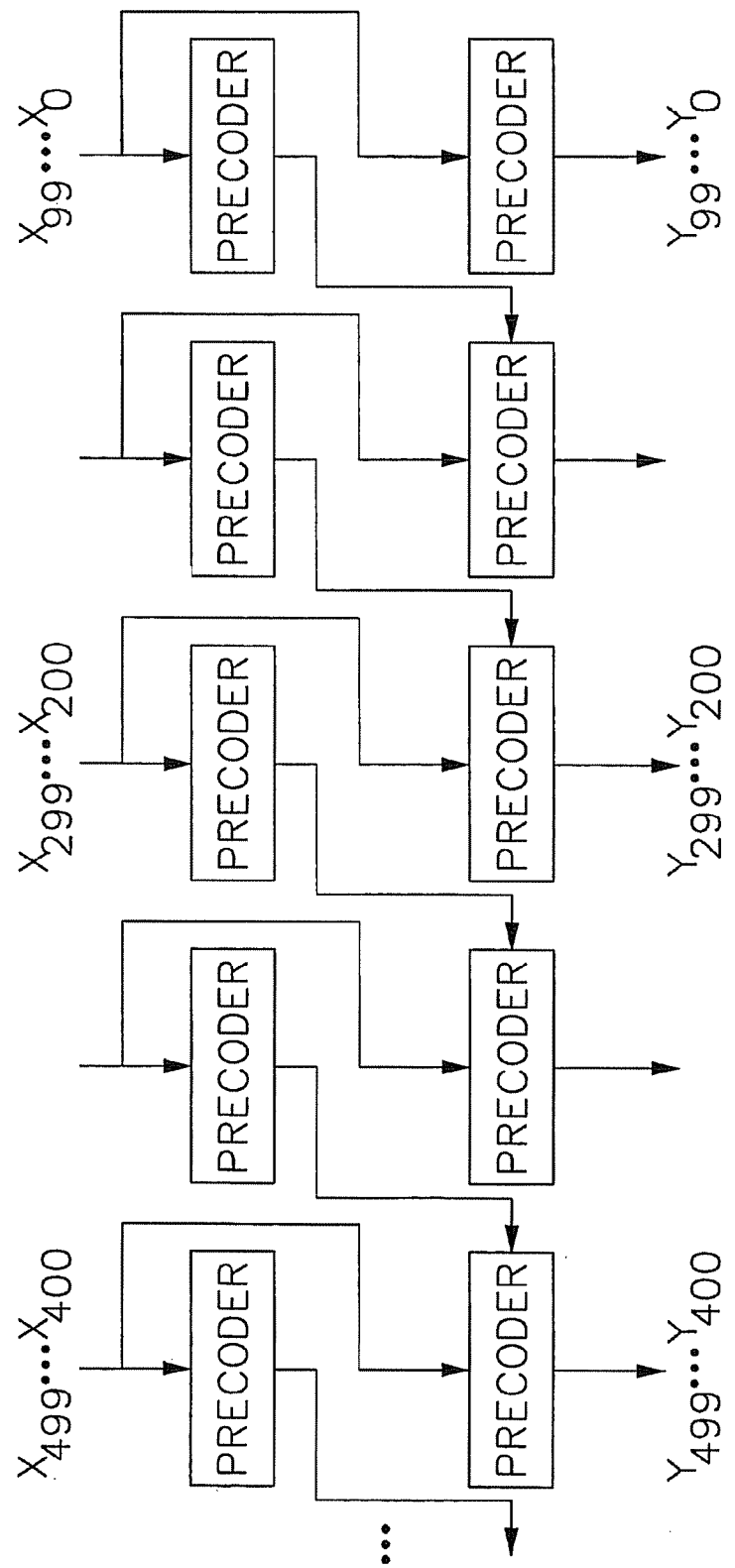
FIG. 10 is a block diagram of one embodiment of a double row Tomlinson-Harashima precoder in accordance with the invention.

FIG. 10 is a simplified block diagram of another embodiment of a parallel precoder comprising a double row precoder. To reduce the complexity of FIG. 10 only a few representative precoders and associated inputs and outputs have been illustrated.

In this embodiment, each precoder operates on 100 symbols in, for example, a serial manner. All but one of the precoders in the lower row receives an input associated with 100 preceding inputs from an associated precoder in the top row.

For the example where there are 16 parallel precoders, 1600 outputs are computed in 100 clock cycles. This embodiment has the advantage that the hardware overhead is only increased by a factor of two. However, the latency is longer (100 clock cycles in this example) and buffers are needed to buffer the data for the 100 clock cycles.

Figure 11:
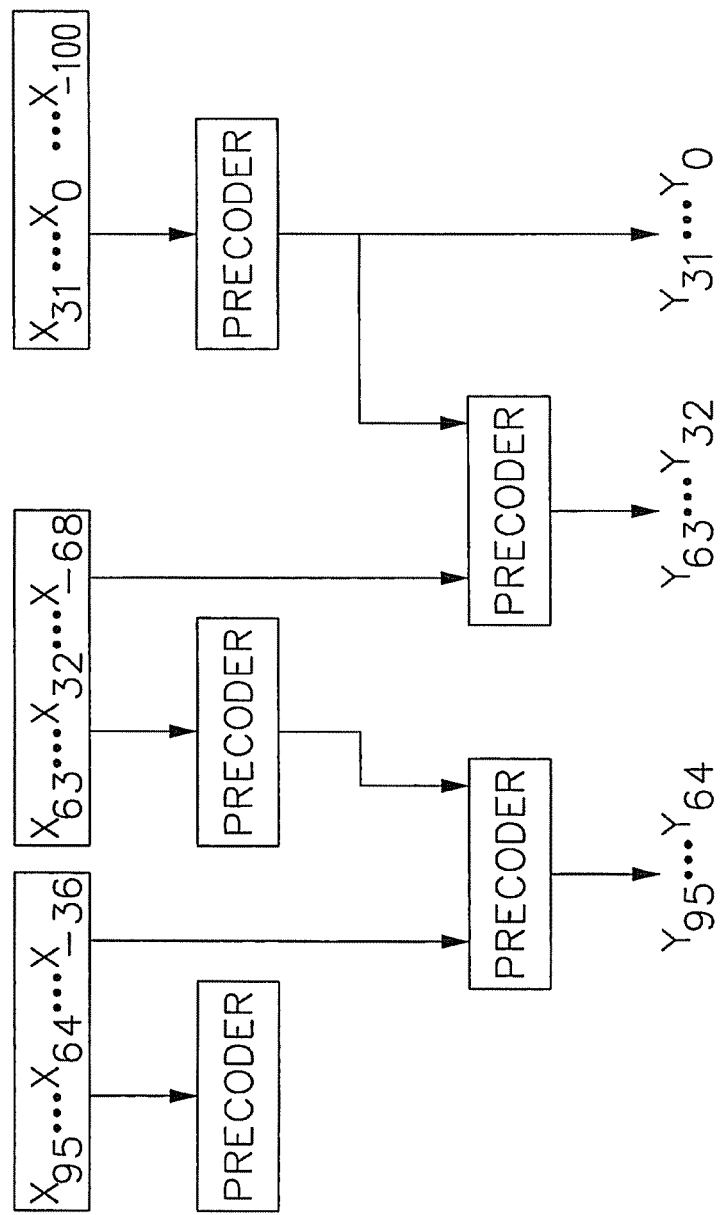
FIG. 11 is a block diagram of another embodiment of a double row Tomlinson-Harashima precoder in accordance with the invention.

FIG. 11 is a simplified block diagram of another embodiment of a parallel precoder comprising an overlapped double row precoder. To reduce the complexity of FIG. 11 only a few representative precoders and associated inputs and outputs have been illustrated.

In this embodiment there is an overlap of 32 samples between the precoders in the top row. The latency is only 32 clock cycles. However, buffers are needed.

The lower row of precoders can be operated at a clock speed that is approximately four times slower than the clock speed of the top row of precoders. This is because the precoders in the top row operate on 132 samples while the precoders in the bottom row operate on 32 samples. Thus, folding (time multiplexing) can be exploited to optimize the circuit.

Figure 12:
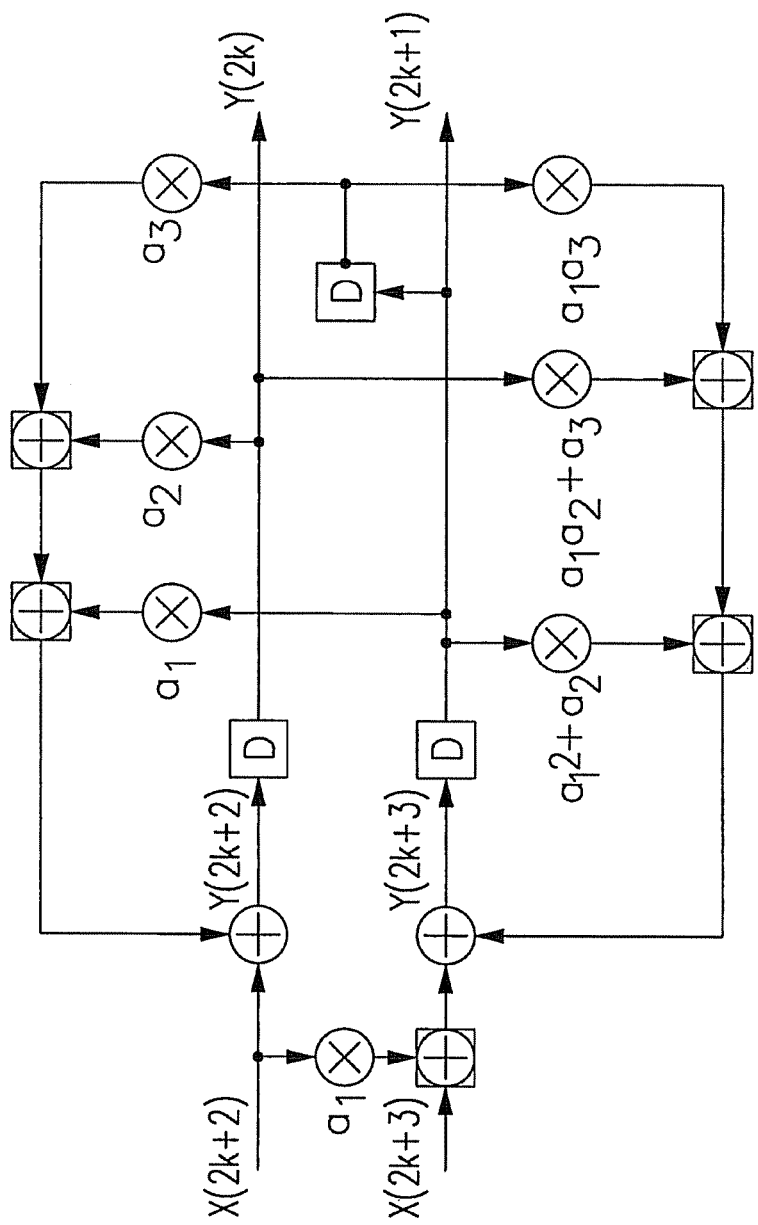
FIG. 12 is a block diagram of another embodiment of a parallel Tomlinson-Harashima precoder in accordance with the invention.

FIG. 12 is a simplified block diagram of another embodiment of a basic parallel precoder comprising two parallel stages of a 3-tap infinite impulse response (IIR) filter. The circuit may be described by the following equations:

$$y(n) = a_1 y(n-1) + a_2 y(n-2) + a_3 y(n-3) + x(n) \quad \text{EQUATION 1}$$

$$y(n) = a_1[y(n-2) + a_2 y(n-3) + a_3 y(n-4) + x(n-1)] + a_2 y(n-2) + a_3 y(n-3) + x(n) \quad \text{EQUATION 2}$$
$$= (a_1^2 + a_2) y(n-2) + (a_1 a_2 + a_3) y(n-3) + a_1 a_3 y(n-4) + a_1 x(n-1) + x(n)$$

$$n = 2k + 2 \text{ in equation (1) and } n = 2k + 3 \text{ in equation 2.} \quad \text{EQUATION 3}$$
$$y(2k+2) = a_1 y(2k+1) + a_2 y(2k) + a_3 y(2k-1) + x(2k+2)$$

$$y(2k+3) = a_1^2 + a_2) y(2k+1) + (a_1 a_2 + a_3) y(2k) + a_1 a_3 y(2k-1) + a_1 x(2k+2) + x(2k+3) \quad \text{EQUATION 4}$$

Extending this concept to an L-parallel implementation, y(kL+L) ... y(kL+2L−1) is computed in terms of y(kL) ... y(kL+L−1). In an L-parallel implementation, the clock speed is L times slower than the symbol speed, i.e., each delay element is L-times slower.

This basic implementation provides high speed and low latency. In addition, it is more stable because the poles are raised to the Lth power. Moreover, it has better finite precision effect. However, this implementation is suboptimal because it is difficult to minimize the power of the output. Hence, the embodiments of FIGS. 7-11 are preferred because these embodiment overcome this problem.

Figure 13:
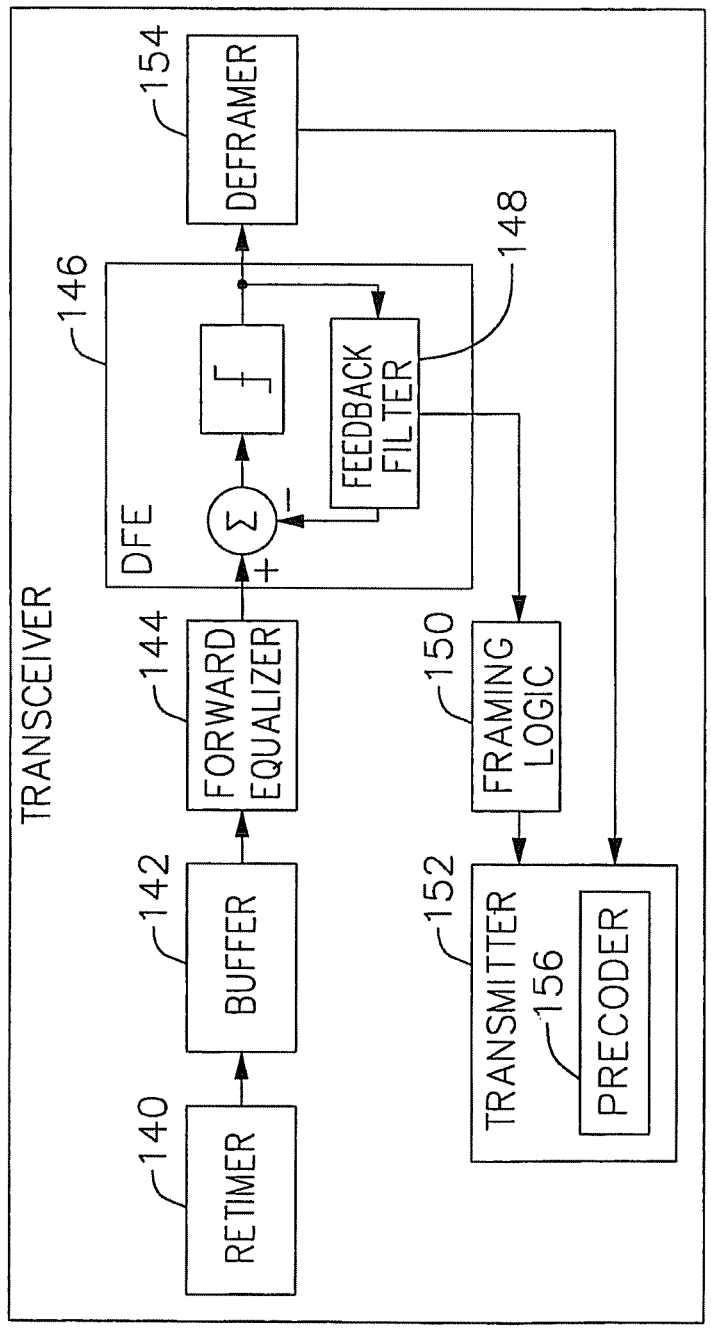
FIG. 13 is a block diagram of one embodiment of a precoder initializer in accordance with the invention.

Referring now to FIG. 13, one embodiment of a circuit that provides precoder initialization is described. In this embodiment, information related to the characteristics of the channel (e.g., precoder coefficients) are transmitted from the receive section of one transceiver to the transmit section of another transceiver over the channel. This initialization procedure takes place before the channel is completely operational.

During initialization a buffer captures a block of N samples (e.g., N=1024) from the ADC at a 312.5 MHz clock rate. For example, in the receive section of the transceiver, the sixteen, 6 bit, 312.5 MHz signals from a retimer 140 (i.e., retiming 98 in FIG. 5) are stored in a buffer 142.

Data from the buffer 142 is read out to provide the input for an auxiliary decision feedback equalizer. However, the forward equalizer 144 and decision feedback equalizer 146 are designed to operate at a reduced clock rate, for example, $F_{SLOW}$=100 MHz, using the samples from the buffer 142.

While the buffer is being emptied, signal samples from the ADC are discarded. However, it will be appreciated that useful data can be transmitted and received during these blocks, except for a transient period at the beginning of the block. Since this procedure is executed at both ends of the link, this establishes a full-duplex channel with a data rate of approximately 200 Mbit/s (for $f_{SLOW}$=100 MHz).

In one embodiment, this auxiliary channel may be used during startup to send, for example, decision feedback equalizer coefficients from the receiver to the transmitter thereby enabling programming of the precoder. For example, channel information generated by a feedback filter 148 in the decision feedback equalizer 146 may be sent to framing logic 150 that frames the channel information and, in cooperation with the transmitter 152, inserts it into the channel for retrieval by the receiver on the other side of the channel. The framing operation would include, for example, adding a marker to indicate the beginning of the channel information.

Then when that channel information is received, a deframer 154 reads the output of the decision feedback equalizer 146 to obtain the channel information. Here, the deframer 154 determines which input data is valid and locates the marker that identifies the beginning of the channel information. The deframer 154 sends this channel information to its transmitter to update the coefficients in the transmitter's precoder 156.

In another embodiment, the precoder 156 is continually adapted to the channel during normal operation of the transceiver (e.g., when the channel is carrying data). In this case, a portion of the bandwidth of the channel is allocated to carry the channel information.

In one embodiment the channel information consists of coefficients generated by an adaptive equalization algorithm such as least mean square (1 ms). This information may be in the form of 16-bit words. The framer and associated processing would serialize these 16-bit words and route the serial bits to be sent over the channel. At the other end of the channel, the deframer and associated processing use known characteristics of the coefficients to reassemble the coefficients and program each coefficient in the appropriate manner in the precoder. In accordance with the invention, other methods of generating channel information may be used as well as other types of information that characterize the channel. In these embodiment, additional processing may be needed to generate coefficients or other information for the precoder.

Figure 14:
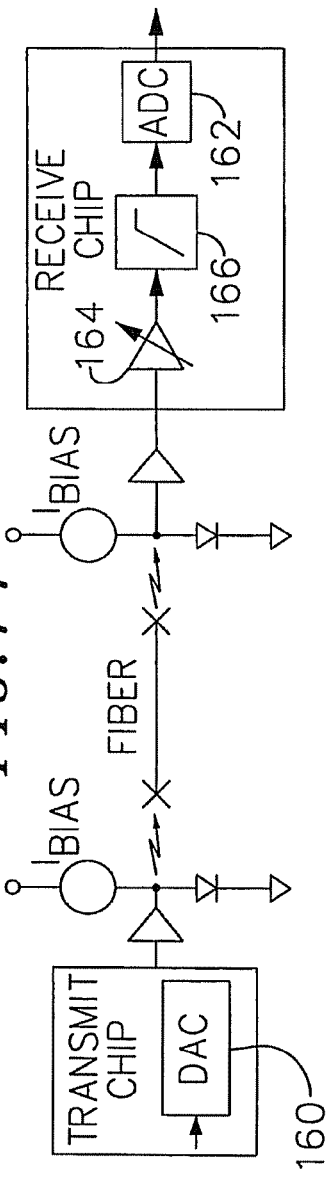
FIG. 14 is a block diagram of one embodiment of an analog interface in accordance with the invention.

Referring now to FIGS. 14-19, one embodiment of an analog interface for the transmission system will be treated in more detail. FIG. 14 depicts a high level view of an analog interface that may be used for a 10 Gbit/s Ethernet channel. The input to the DAC 160 in the transmit section consists of a signal with 8-bit resolution. In this case, a minimum of 6 bit resolution is required for the ADC 162 in the receive section. Both the DAC 160 and the ADC 162 operate at a clock rate of 5 GHz. The receive high pass corner is 200 MHz. The receive section also includes a −20 ... 0 dB attenuator for amplitude control.

Figure 15:
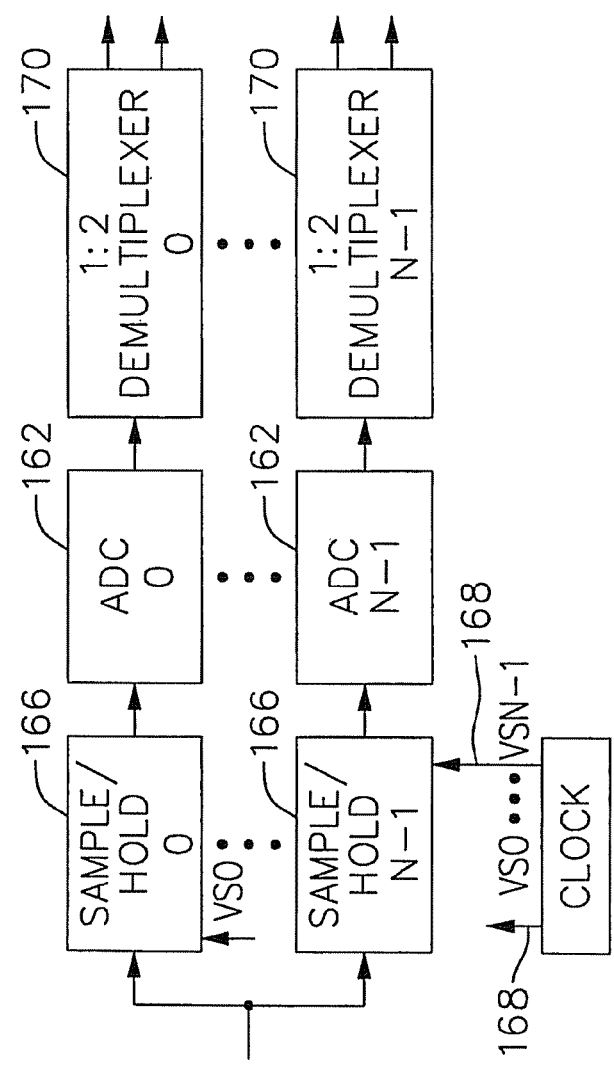
FIG. 15 is a block diagram of one embodiment of an analog to digital converter in accordance with the invention.

FIG. 15 depicts one embodiment of a receive ADC using, for example, eight (assuming N=8) parallel interleaved ADCs 162. Each of the eight ADCs 162 generate 6 bit samples at a sampling rate of 5 GHz/8=625 MHz. Sample and hold circuits 166 are used to guarantee a low jitter sampling. A clock 168 generates eight phases 168 of the sample clock, spaced at 200 picoseconds. In this way the ADCs 168 are effectively interleaved so that each ADC processes a portion of the input signal. Gain and phase errors between the ADCs may be compensated for digitally.

In some embodiments a demultiplexer may be used to widen the data bus form the ADCs 168. For example, again assuming N=8, in the embodiment of FIG. 15 eight 1:2 multiplexers 170 are used to convert the eight 625 MHz digital outputs of the ADCs 168 to sixteen 312.5 MHz signals.

In one embodiment, the ADCs are implemented in 0.15μ CMOS with a 1.8 V supply voltage, differential analog input of 1.0 Vpp, distortion at 2 GHz<−40 dB, a bit error rate of $10^{-15}$, and clock jitter of <1.5 picosecond rms.

Figure 16:
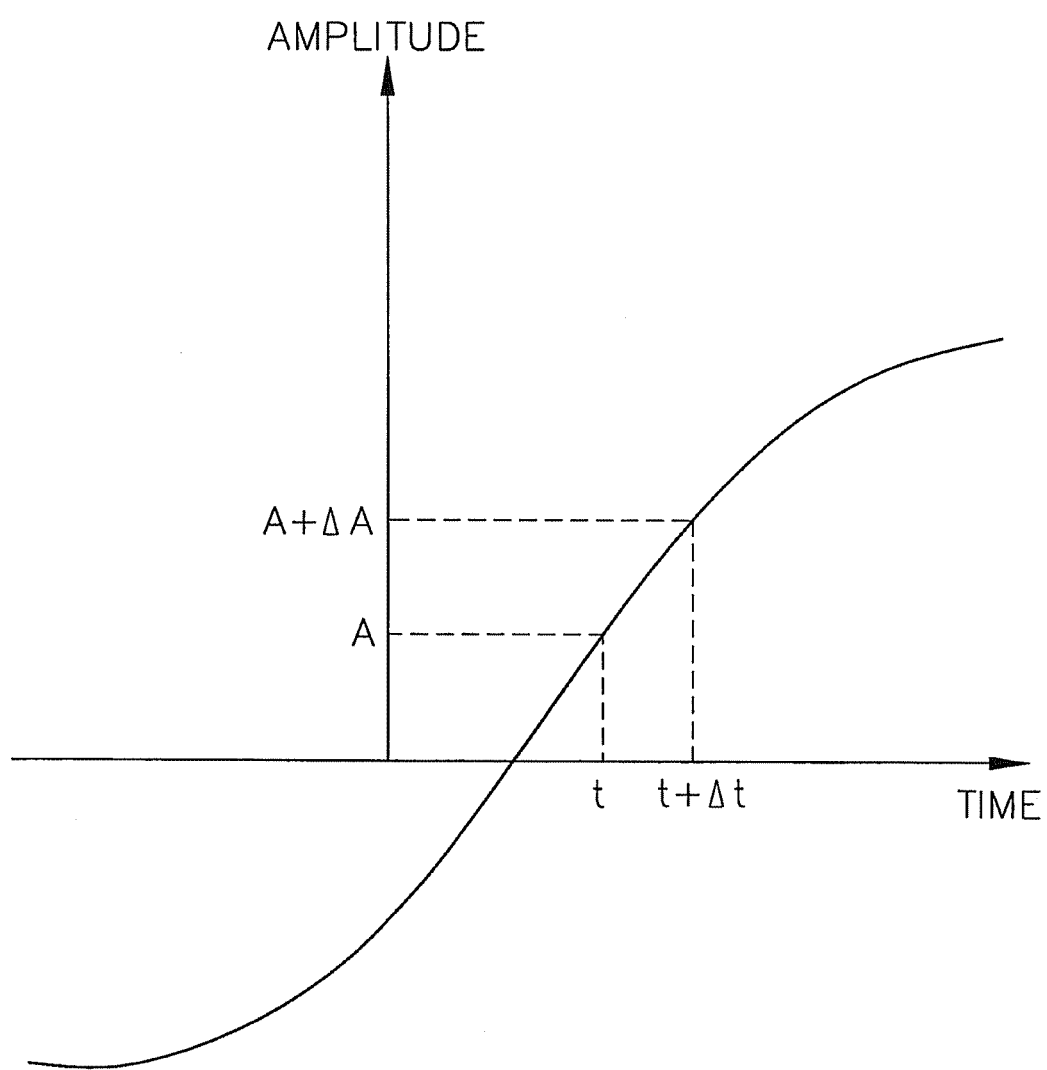
FIG. 16 is a graph of clock jitter specifications for one embodiment of an analog interface in accordance with the invention.

FIG. 16 depicts exemplary clock jitter requirements. Vin is defined as A sin ωt (assuming a sine wave input signal). Maximum amplitude is assumed to be 1 LSB. And $\Delta t = \Delta A/(A \omega \cos \omega t)$ with $\Delta A = 2A/2^n$.

Then $\Delta t = 2^{-n}/\pi f_{in} \cos(2 n f_{in} - t)$, where $f_{in}$=input frequency and n=the resolution of the ADC. The maximum at zero crossing of the input signal $\Delta t_{max} = 2^{-n}/\pi f_{in}$. Where n=6 and $f_{in}$=1 GHz, $\Delta t_{max}$=5 picoseconds.

Figure 17:
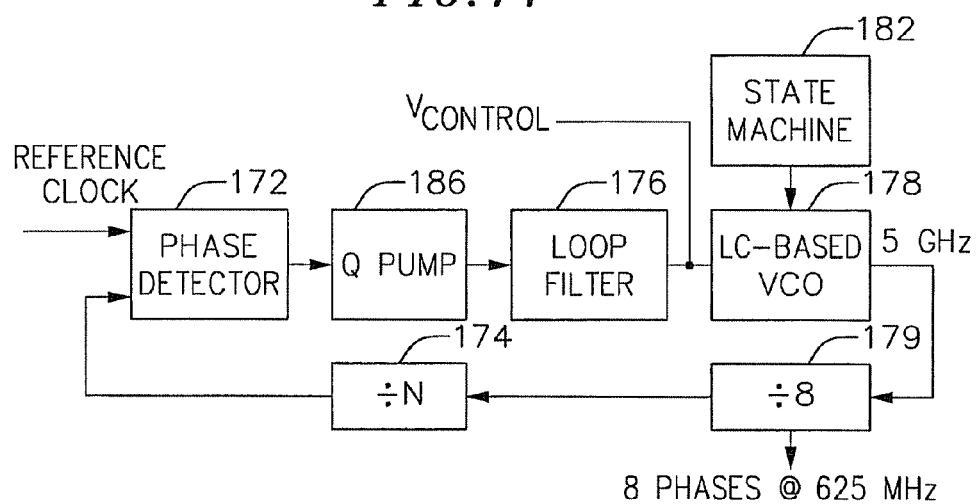
FIG. 17 is a block diagram of one embodiment of a phase locked loop in accordance with the invention.

FIG. 17 is a block diagram of one embodiment of a phase locked loop architecture with eight interleaved clocks operating at 625 MHz. A phase detector 172 compares the phase of the reference clock and a divide-by-N circuit 174. The output of the phase detector 172 is sent to a charge pump (Q pump) 186 and then a loop filter 176 to generate a control voltage for an LC-based voltage controlled oscillator 178. A divide-by-8 circuit 179 provides eight phases of a 625 MHz clock.

Figure 18:
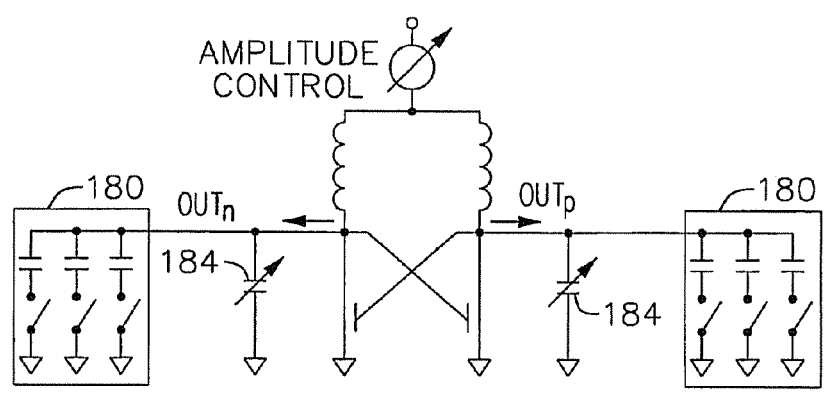
FIG. 18 is a block diagram of one embodiment of a voltage controlled oscillator in accordance with the invention.

FIG. 18 is a block diagram of one embodiment of an LC-based voltage controlled oscillator for a low jitter clock generator. Switched capacitors 180 are controlled by the state machine 182 (FIG. 17) to adjust the VCO center frequency over process and temperature (+/−20%). The varactor 184 is controlled by the charge pump 186 (FIG. 17). This implementation utilizes a differential approach for power supply and substrate noise immunity.

Figure 19:
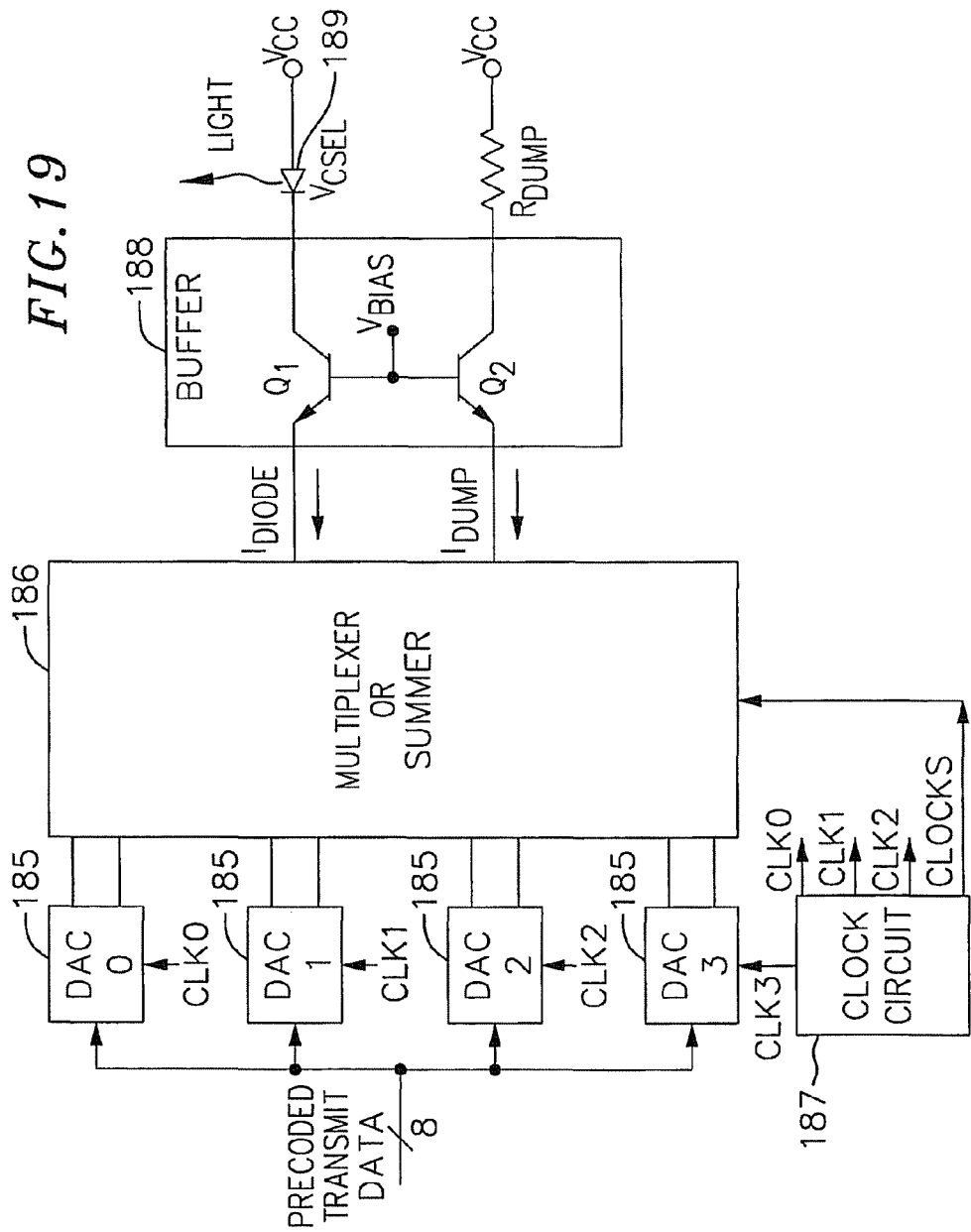
FIG. 19 is a schematic diagram of one embodiment of a digital to analog converter circuit and an optical interface circuit in accordance with the invention.

FIG. 19 is a block diagram of one embodiment of a DAC circuit and transmit optical interface. The input to the circuit is an 8-bit digital signal. The output is a 5 gigasample per second signal. In one embodiment, a current-mode DAC circuit converts precoded PAM-5 symbols to driver current.

Significantly, this embodiment uses parallel interleaved DACs and a multiplexer or summer to accomplish high speed digital to analog conversion. That is, the output signals from the four 1.25 GHz current mode DACs 185 are interleaved to provide a 5 gigasample per second output signal.

In a preferred embodiment the DACs and the multiplexers are implemented using 0.15 g CMOS. Representative characteristics of this preferred embodiment include: spurious-free dynamic range>48 dB; total harmonic distortion>48 dB; single-ended output current=5 to 15 mA; and output capacitance<5 pF.

In one embodiment the 125 GHz output signals from the DACs 185 are sent to a multiplexer 186. The multiplexer 186 time-multiplexes the four 125 GHz signals to generate a 5 GHz output signal under control of the clock signals generated by a clock circuit 187.

In another embodiment the 125 GHz output signals from the DACs 185 are sent to a summer 186. In this case, the outputs of the DACs are, in effect, tied together. Time-division multiplexing of the 125 GHz signals to produce a 5 GHz signal is accomplished in this case by carefully controlled timing of the clock signals to the DACs 195. For example, CLK0, CLK1, CLK2 and CLK3 may be phase shifted from one another so that, in effect, only one of the DACs 195 drives its output at a given time.

The output of the multiplexer 186 or the summer 186 drives a buffer 188. The function of the buffer is to isolate the capacitive output of the DAC circuit (e.g., DACs 185 and multiplexer/summer 186) from the series resistance of the laser diode 189. Typically, the interleaving of the DACs 185 results in a relatively high output capacitance for the DAC circuit. Thus, the buffer 188 reduces the bandlimiting effect that this relatively high output capacitance would have on the output signal.

In one embodiment, the buffer 188 is a current buffer. One embodiment of a current buffer is shown in FIG. 19. The NPN transistors Q1 and Q2 may, for example, be silicon germanium RF transistors made with 70 GHz ft SiGe process. One example of a suitable transistor is the Infineon BFP620 transistor.

An example operating point for the current buffer of FIG. 19 is: Idiode_DC=approximately 10 mA; input impedance<4.0 ohms; input capacitance<0.9 pF; and output capacitance<0.15 pF.

Typically the optical output device is a laser diode 189 as depicted in FIG. 19. For example, a vertical cavity surface emitting laser (VCSEL) may be used. In one embodiment the operating characteristics of the laser diode may be: Ion max=5 mA; input capacitance<0.8 pF; and series resistance<30 ohms.

The specific implementation of a DAC circuit and a transmit optical interface according to the invention may take many forms. For example, the number, format and speed of the input signals, the number of DACs, the operating speed and characteristics of the components and the speed of the output signal depend on system design requirements.

Moreover, different types of DACs, multiplexers, summers, buffers and optical output devices may be used to implement a DAC circuit and transmit optical interface according to the invention. For example, many of these components may be implemented in silicon germanium. The multiplexer 186 may be implemented in a separate integrated circuit than the DACs 185. The DACs 185 may be implemented in a different integrated circuit than the rest of the transmitter. Different circuits may be used for the current buffer. The buffer 188 may be a voltage buffer instead of a current buffer.

In practice, the number of ADCs, DACs, clock signals and the respective operating speed of each of the components described above in conjunction with FIGS. 14-19 will depend, for example, on the number of parallel levels of these and other components in the system as well as on the desired operating speed of these components and the data rates of the input and output signals.

Figure 20:
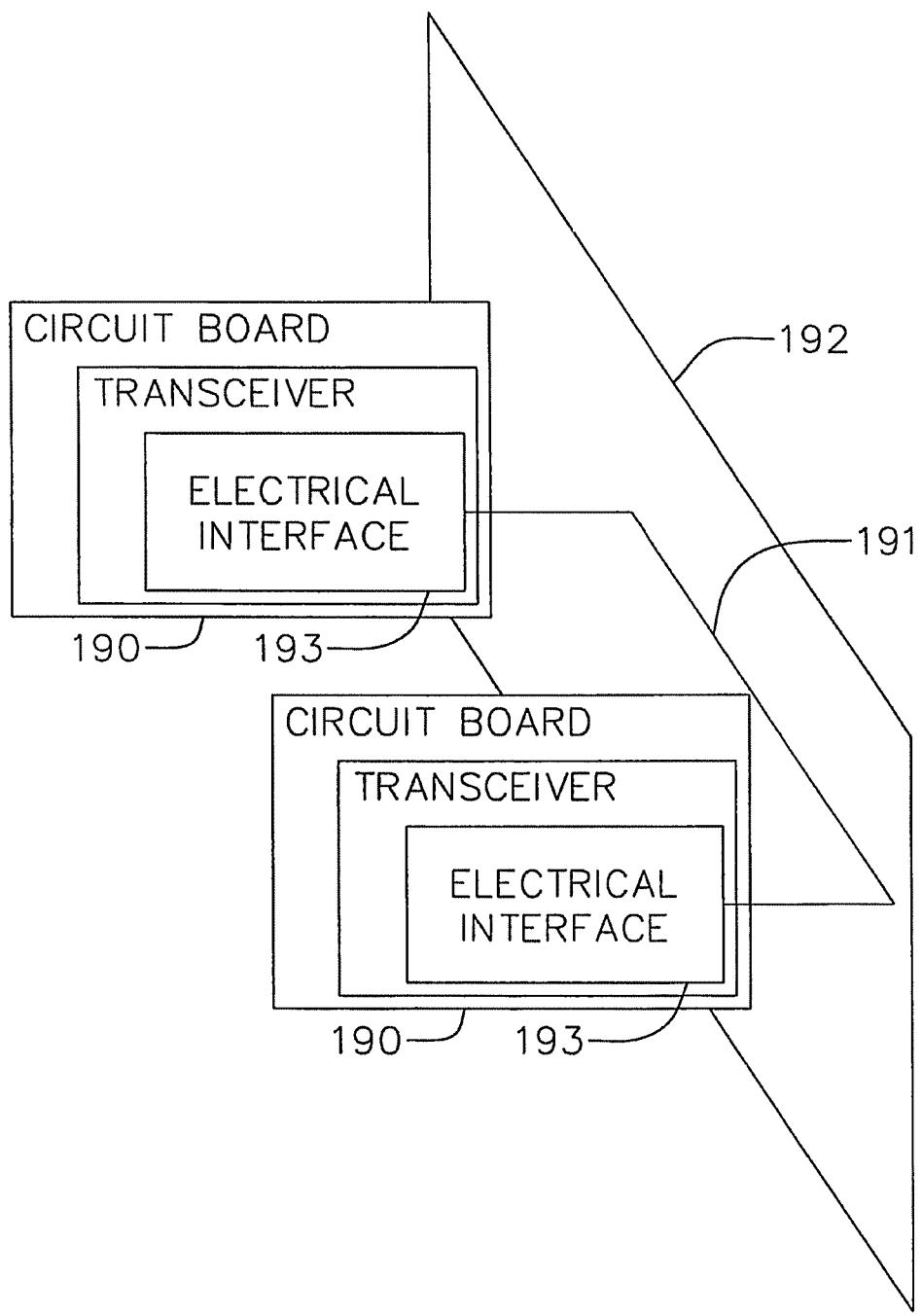
FIG. 20 is a block diagram of one embodiment of a communications system having an electrical physical interface and incorporating transceivers with equalization precoding in accordance with the invention.

FIG. 20 is a block diagram of one embodiment where transceivers implementing the teachings of the invention are used to transmit electrical signals between circuit boards 190 over a backplane 192. In this embodiment, coded PAM-5 signals are driven over electrical paths 191 in the backplane 192 by electrical interfaces 193. It should be understood that, in general, the primary difference between the circuit of FIG. 20 and the other circuits described herein is the use of an electrical interface rather than an optical interface (as shown in FIG. 1). Thus, the embodiment of FIG. 20 may include, for example, parallel precoding and/or other techniques as described and taught herein in accordance with the invention. Typically, the length of the electrical path in this implementation would be limited to a distance of approximately 30 inches.

Figure 21:
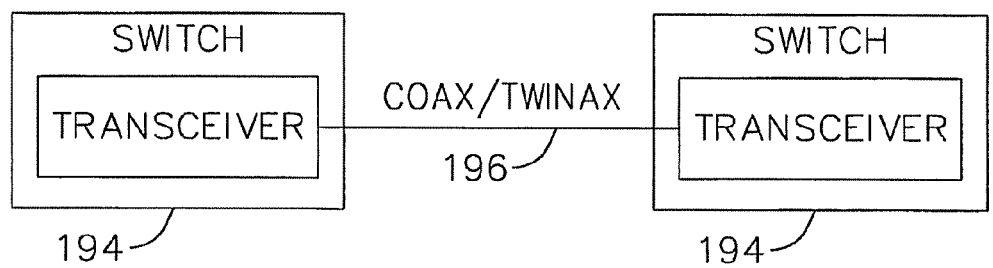
FIG. 21 is a block diagram of another embodiment of a communications system having an electrical physical interface and incorporating transceivers with equalization precoding in accordance with the invention.

FIG. 21 is a block diagram of an embodiment where transceivers implementing parallel precoding according to the teachings of the invention are used to transmit electrical signals between router switches 194 via at least one coaxial or twinaxial cable 196. This embodiment is similar to the one described in conjunction with FIG. 20 except that the electrical interface (not shown) may be particularly adapted to drive coaxial cable or twinaxial cable. Typically the length of the cable 196 in this implementation with PAM-5 signals operating at 5 GHz would be limited to a distance of approximately 10-15 meters.

Figure 22:
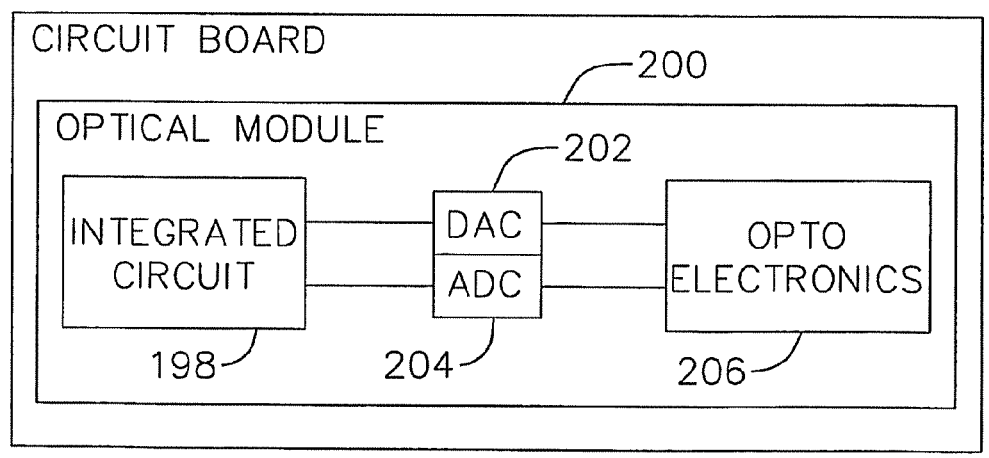
FIG. 22 is a block diagram of one embodiment of an optical transceiver module incorporating equalization precoding in accordance with the invention.

FIG. 22 is a block diagram of one embodiment where transceivers 198 implementing precoding according to the teachings of the invention are incorporated into an optical module 200 with DACs 202, ADCs 204 and optoelectronics 206. The optoelectronics used for a transceiver typically incorporates a laser photodetector, a laser driver and amplifiers including a trans-impedance amplifier.

The teaching of the invention may be incorporated into a wide variety of implementations. For example, many of the components described herein may or may not be used in a given implementation. One embodiment of a system constructed according to the invention does not use trellis decoding or trellis decoding. In this case, in the transmitter the uncoded digital signals may be input to the parallel Tomlinson precoders. In the receiver the digital output of the forward equalizers may be passed directly to the physical coding sublayer. This embodiment may be used to reduce system cost and/or power dissipation. However, in general, a system without trellis decoding will have a higher bit error rate. In addition, such a system typically would be operated with a channel with a higher signal-to-noise ratio (S/N).

Another embodiment of a system constructed according to the invention uses the forward equalizers, but not the transmit equalization. In general, this system typically would be used in relatively low noise environments because noise may be amplified to a greater extent by the forward equalizers. In this case, in the receiver the output of the ADC section may pass directly to the trellis decoder (if trellis coding is used) or, in some embodiments, to other digital signal processing operations.

Another embodiment of a system constructed according to the invention does not use a forward equalizer. In this case, all equalization may be performed in the precoder or in a decision feedback equalizer. Typically this embodiment may be used when the communications system has little or no intersymbol interference.

Another embodiment of a system constructed according to the invention does not use Tomlinson-Harashima precoding. For example, some systems do not provide equalization.

Figure 23:
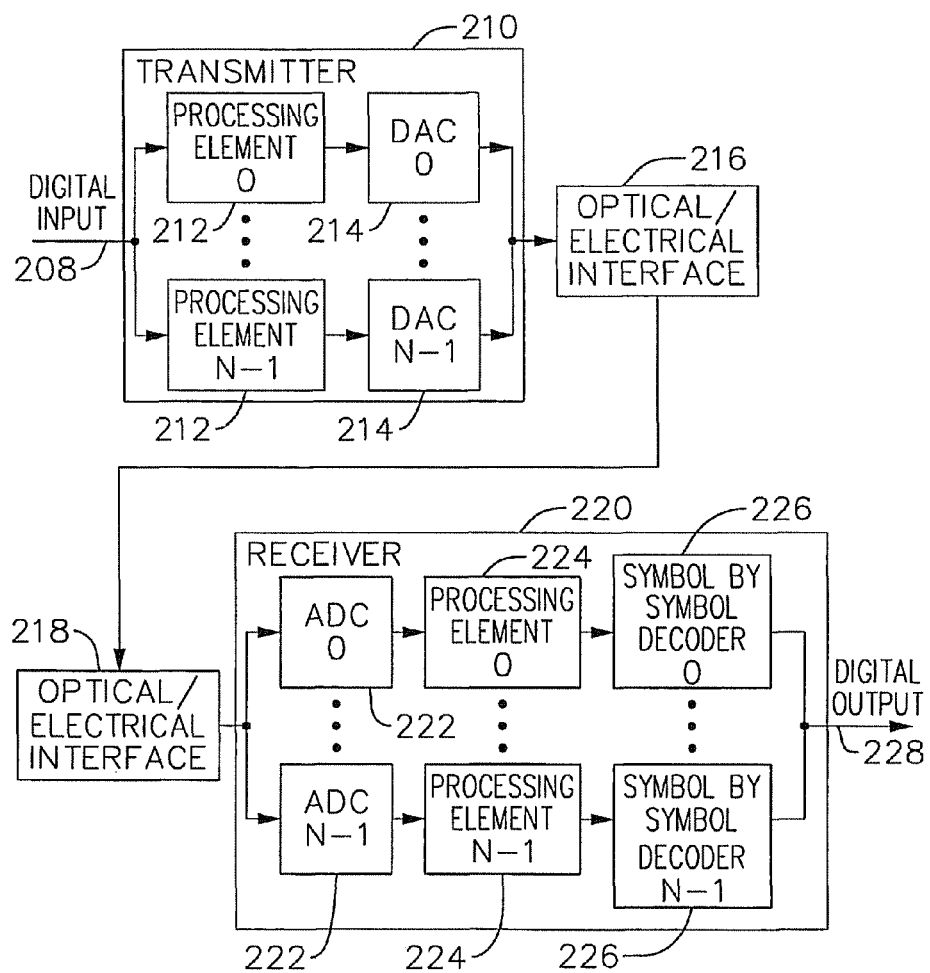
FIG. 23 is a block diagram of one embodiment of a system incorporating symbol-by-symbol decoding and/or alternative digital signal processing in accordance with the invention.

An example of a system that may not incorporate equalization will be described below in conjunction with the simplified block diagram of FIG. 23. FIG. 23 illustrates, in part, that a variety of processing tasks may be performed by a system designed in accordance with the invention. To this end, a transmitter 210 and a receiver 220 are shown as including one or more processing elements 212 and 224, respectively. In some embodiments these processing elements may be implemented in parallel.

The processing elements 212 typically comprise circuitry that performs processing functions, for example, a digital signal processor. A transmit-side processing element 212 may comprise, for example, a transmit equalizer such as a pre-emphasis filter, a Tomlinson-Harashima precoder and/or a dynamics limited precoder. In some embodiments, a processing element 212 may comprise, for example, a trellis encoder, a convolutional encoder, or a block encoder.

The receive-side processing elements 224 typically comprise circuitry that performs processing functions, for example, a digital signal processor. A processing element 224 may comprise, for example, a crosstalk canceller, a forward equalizer and/or a decision feedback equalizer. In some embodiments, a processing element 224 may comprise, for example, a trellis decoder, a convolutional code decoder, or a block code decoder. In other embodiments, the processing elements 224 are not incorporated into the design.

In one implementation of the embodiment of FIG. 23, digital input signals 208 to the transmitter 210 are processed by one or more processing elements 212. In other embodiments, the processing elements 212 are not incorporated into the design. In the latter case, the transmitter typically would not perform coding or equalization operations.

If a processing element is incorporated into the design, the output of a processing element 212 is eventually sent to a DAC 214 which may be implemented, for example, as described herein. The output of a DAC 214 (or the multiplexed outputs of the DACs 214 in the case of parallel DACs 214) is sent over a channel via optical or electrical interfaces 216 and 218 to the receiver 220. One or more ADCs 222 in the receiver 220 convert the analog signal to digital signals, for example, as discussed herein, to perhaps be processed by one or more processing elements 224 and/or one or more symbol-by-symbol decoders 226.

In some embodiments, the processing elements 224 are not incorporated into the design. In this case, the receiver may not perform decoding or equalization operations.

If the symbol-by-symbol decoder 226 is incorporated into the design, is may be implemented as a relatively simple threshold detection device that compares the input signal with threshold levels to determine, for example, the PAM level of the received signal (e.g., −2, −1, 0, 1, 2). The symbol-by-symbol decoder functions may be implemented by a digital signal processor.

In view of the above, it may be seen that the use of precoding may provide several advantages over receiver equalization. A parallel precoder is, in general, easier to implement than a parallel decision feedback equalizer in the receive section. When using trellis coded modulation, precoding simplifies the implementation of the trellis decoder because the trellis decoder does not need to resolve the effects of intersymbol interference. Precoding avoids error propagation, which may be a problem in decision feedback equalizers. Moreover, the techniques described herein provide an asymptotically optimal architecture in that the combination of precoding with coded modulation approaches the Shannon bound for channel capacity when good modulation codes are used.

The illustrative systems described herein may be implemented in a variety of ways. For example the transmitter and receiver sections 50 and 82 typically would be implemented as a CMOS PHY transceiver integrated circuit. This implementation may provide very good performance at a relatively low cost. It should be appreciated, however, that these circuits may be implemented on separate integrated circuits. For example, the transmitter and receiver sections may be implemented on separate chips. The DACs and ADCs may be implemented on chips apart from the other components of the transmitter and receiver. In addition, the transmitter and receiver or some of their components may be implemented using different integrated circuit technology. For example, the DACs and ADCs may be implemented as silicon germanium devices.

The chip interfaces (e.g., buses 28 and 32 in FIG. 1) may take a variety of different forms. In one embodiment the interfaces between the transmitter 50 and the media access controller 52 (FIG. 2) and between the receiver 82 and the media access controller 85 (FIG. 5) consist of XAUI interfaces. In another embodiment the chip interfaces may comprise X-GMII interfaces. It should be understood, however, that the type of the chip interface will depend on the particular application in which the chip will be used. For example, different interfaces may be specified for different data rates, difference bus architectures and so forth.

As described above, the teaching of the invention can be applied to both optical and non-optical channels (e.g., electrical and wireless channels). Optical channels include, for example, single mode fiber and multimode fiber. In particular the embodiment described in conjunction with FIGS. 1-6 can operate over existing multimode fiber installations up to distances of at least 300 meters. The system can operate with single channel optoelectronics. That is, a single laser and a single photodetector. Significantly, the invention provides an especially attractive system for transmitting high speed data over multimode fiber because these equalization techniques effectively compensate for the bandwidth limitations of this type of fiber.

The parallel processing techniques according to the invention may be implemented in many different ways as well. For example, the number of parallel convolutional encoder/decoders, block encoders/decoders, trellis encoders/decoders, Tomlinson-Harashima precoders, DACs, ADCs, forward equalizers, digital signal processor elements and symbol-by-symbol decoders used in a given implementation will depend on system design requirements. Similarly the speed at which these circuits operate will depend on the number of parallel levels and the speed of the transceiver input and output signals. In general, typical design requirements include the speed of the input signal, the speed of the integrated circuit technology, the maximum power dissipation and the desired cost of the integrated circuit.

In many embodiments the main processing elements treated herein such as the parallel convolutional encoder/decoders, block encoders/decoders, pre-emphasis filters, decision feedback equalizers, trellis encoders/decoders, Tomlinson-Harashima precoders, forward equalizers, digital signal processor elements and symbol-by-symbol decoders may be implemented as separate digital signal processor elements on an integrated circuit. Depending on system design requirements, as discussed herein a system constructed according to the invention may incorporate parallel implementations of some or all of the these digital signal processors.

The invention may be practiced with different data modulation schemes. Including, for example, any level of PAM coding (e.g., PAM-3, PAM-7).

A variety of components may be used to implement the electrical-optical interfaces (e.g., optical interfaces 40 and in FIG. 1). These interfaces may include lasers and photodetectors and other types of optical transmitters and optical receivers.

Also, the invention may be practiced with a wide variety of encoding and decoding schemes. Including different trellis encoding schemes and convolutional encoding and block encoding.

In summary, the invention described herein provides an effective communications system using equalization precoding. While certain exemplary embodiments have been described in detail and shown in the accompanying drawings, it is to be understood that such embodiments are merely illustrative of and not restrictive of the broad invention. It will thus be recognized that various modifications may be made to the illustrated and other embodiments of the invention described above, without departing from the broad inventive scope thereof. In view of the above it will be understood that the invention is not limited to the particular embodiments or arrangements disclosed, but is rather intended to cover any changes, adaptations or modifications which are within the scope and spirit of the invention as defined by the appended claims.

What is claimed is:

1. A receiver for processing an analog signal, comprising:
a plurality of n interleaved analog-to-digital converters operable to generate a plurality of digital signals, wherein each analog-to-digital converter is operable to: receive a unique phase of a clock signal ($f_D$) and sample a symbol in the analog signal according to the unique phase;
a retiming circuit coupled to n outputs of the analog-to-digital converters, the retiming circuit configured to align the n outputs from the analog-to-digital converters to provide n samples during each clock cycle ($f_C$), wherein $f_D$ is an n-phase version of $f_C$;
a plurality of parallel forward equalizers coupled to the retiming circuit; and
a plurality of parallel trellis decoders, each coupled to an output of one of the forward equalizers and configured to produce a decoded data stream.

2. The receiver of claim 1, further comprising at least one crosstalk canceller.

3. The receiver of claim 1, further comprising at least one trellis decoder.

4. The receiver of claim 1, further comprising at least one symbol by symbol decoder.

5. The receiver of claim 1, further comprising at least one decision feedback equalizer.

6. The receiver of claim 1, further comprising at least one convolutional code decoder.

7. The receiver of claim 1, further comprising at least one block code decoder.

8. A method for processing an analog signal, comprising:
generating, by n analog-to-digital converters, a plurality of digital signals, wherein each digital signal in the plurality of digital signals is generated by sampling a different symbol in the analog signal according to a unique phase of a clock signal ($f_D$);
aligning, by a retiming circuit, n outputs from the n analog-to-digital converters to provide n samples during each clock cycle ($f_C$), wherein $f_D$ is an n-phase version of $f_C$;
processing the plurality of aligned digital signals in at least one processor, wherein processing the plurality of aligned digital signals comprises parallel forward equalization of the plurality of aligned digital signals; and
producing, by a plurality of parallel trellis decoders, a decoded data stream from the plurality of equalized digital signals.

9. The method of claim 8, wherein processing the plurality of aligned digital signals further comprises crosstalk cancellation.

10. The method of claim 8, wherein processing the plurality of aligned digital signals further comprises trellis decoding.

11. The method of claim 8, wherein processing the plurality of aligned digital signals further comprises symbol by symbol decoding.

12. The method of claim 8, wherein processing the plurality of aligned digital signals further comprises decision feedback equalization.

13. The method of claim 8, wherein processing the plurality of aligned digital signals further comprises convolutional code decoding.

14. The method of claim 8, wherein processing the plurality of aligned digital signals further comprises block code decoding.

15. A receiver for processing an analog signal, comprising:
a plurality of n interleaved analog-to-digital converters configured to receive a unique phase of a clock signal ($f_D$) and sample a symbol in the analog signal according to the unique phase;
a retiming circuit coupled to n outputs of the analog-to-digital converters, the retiming circuit configured to align the n outputs from the analog-to-digital converters to provide n samples during each clock cycle ($f_C$), wherein $f_D$ is an n-phase version of $f_C$; and
a plurality of processors coupled to the retiming circuit, the plurality of processors being configured to perform parallel forward equalization of the aligned outputs and parallel decoding of the equalized outputs to generate a decoded data stream.

16. The receiver of claim 15, wherein the plurality of processors comprises a plurality of parallel forward equalizers.

17. The receiver of claim 16, wherein the plurality of processors further comprises a plurality of parallel decoders, each coupled to an output of one of the forward equalizers and configured to produce the decoded data stream.

18. The receiver of claim 17, wherein the decoders comprise Viterbi decoders.

19. The receiver of claim 18, wherein the analog-to-digital converters and the Viterbi decoders operate at a common operating frequency.

20. The receiver of claim 17, wherein the decoders comprise m-way interleaved, m-dimensional trellis decoders.

* * * * *